(12) United States Patent
Son et al.

(10) Patent No.: US 10,103,163 B2
(45) Date of Patent: Oct. 16, 2018

(54) SEMICONDUCTOR MEMORY DEVICE

(71) Applicant: Samsung Electronics Co., Ltd., Gyeonggi-do (KR)

(72) Inventors: Yong-Hoon Son, Yongin-si (KR); Jin-I Lee, Hwaseong-si (KR); Kyunghyun Kim, Seoul (KR); Byeongju Kim, Hwaseong-si (KR); Phil Ouk Nam, Suwon-si (KR); Kwangchul Park, Suwon-si (KR); Yeon-Sil Sohn, Yongin-si (KR); JongHeun Lim, Hwaseong-si (KR); Wonbong Jung, Seoul (KR)

(73) Assignee: SAMSUNG ELECTRONICS CO., LTD., Samsung-ro, Yeongtong-gu, Suwon-si Gyeonggi-do (KR)

( * ) Notice: Subject to any disclaimer, the term of this patent is extended or adjusted under 35 U.S.C. 154(b) by 37 days.

(21) Appl. No.: 15/249,389

(22) Filed: Aug. 27, 2016

(65) Prior Publication Data

US 2017/0062471 A1 Mar. 2, 2017

(30) Foreign Application Priority Data

Aug. 31, 2015 (KR) .................... 10-2015-0122907

(51) Int. Cl.
*H01L 29/41* (2006.01)
*H01L 27/11582* (2017.01)
(Continued)

(52) U.S. Cl.
CPC .... *H01L 27/11582* (2013.01); *H01L 27/1157* (2013.01); *H01L 29/408* (2013.01);
(Continued)

(58) Field of Classification Search
CPC ..... H01L 27/115; H01L 29/40; H01L 29/423; H01L 29/66; H01L 29/792
See application file for complete search history.

(56) References Cited

U.S. PATENT DOCUMENTS

| 5,231,042 A | 7/1993 | Ilderem et al. |
| 6,426,254 B2 | 7/2002 | Kudelka et al. |

(Continued)

FOREIGN PATENT DOCUMENTS

KR  10-2015-0041537  4/2015

*Primary Examiner* — Asok K Sarkar
*Assistant Examiner* — Dmitriy Yemelyanov
(74) *Attorney, Agent, or Firm* — Muir Patent Law, PLLC

(57) ABSTRACT

A semiconductor memory device is disclosed. The device may include a stack including gate electrodes stacked on a substrate in a vertical direction and insulating patterns interposed between the gate electrodes, vertical channels passing through the stack and connected to the substrate, a tunnel insulating layer enclosing each of the vertical channels, charge storing patterns provided between the tunnel insulating layer and the gate electrodes and spaced apart from each other in the vertical direction, blocking insulating patterns provided between the charge storing patterns and the gate electrodes and spaced apart from each other in the vertical direction, and a bit line crossing the stack and connected to the vertical channels. The blocking insulating patterns may have a vertical thickness that is greater than that of the gate electrodes.

20 Claims, 39 Drawing Sheets

(51) Int. Cl.
  *H01L 27/1157* (2017.01)
  *H01L 29/792* (2006.01)
  *H01L 29/66* (2006.01)
  *H01L 29/40* (2006.01)
  *H01L 29/423* (2006.01)

(52) U.S. Cl.
  CPC .... *H01L 29/4234* (2013.01); *H01L 29/66833* (2013.01); *H01L 29/7926* (2013.01)

(56) References Cited

U.S. PATENT DOCUMENTS

| | | |
|---|---|---|
| 7,157,328 B2 | 1/2007 | Tews et al. |
| 7,807,580 B2 | 10/2010 | Lee et al. |
| 8,373,239 B2 | 2/2013 | Siddiqui et al. |
| 8,445,347 B2 | 5/2013 | Alsmeier |
| 8,470,671 B1 | 6/2013 | Lin et al. |
| 8,932,948 B2 | 1/2015 | Sel et al. |
| 2010/0117141 A1 | 5/2010 | Shin et al. |
| 2012/0112260 A1* | 5/2012 | Kim ................... H01L 27/11556 257/315 |
| 2012/0208347 A1* | 8/2012 | Hwang ............... H01L 27/1157 438/430 |
| 2015/0097222 A1 | 4/2015 | Lee et al. |

\* cited by examiner

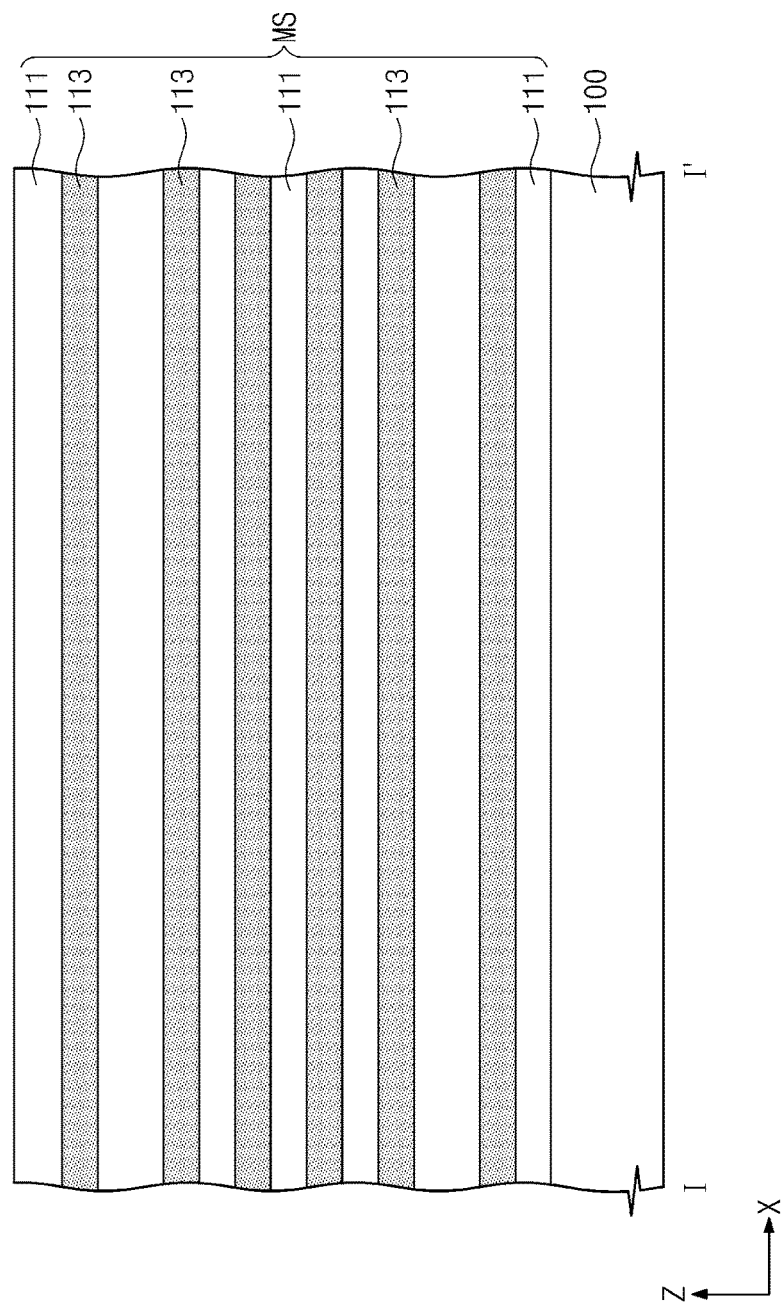

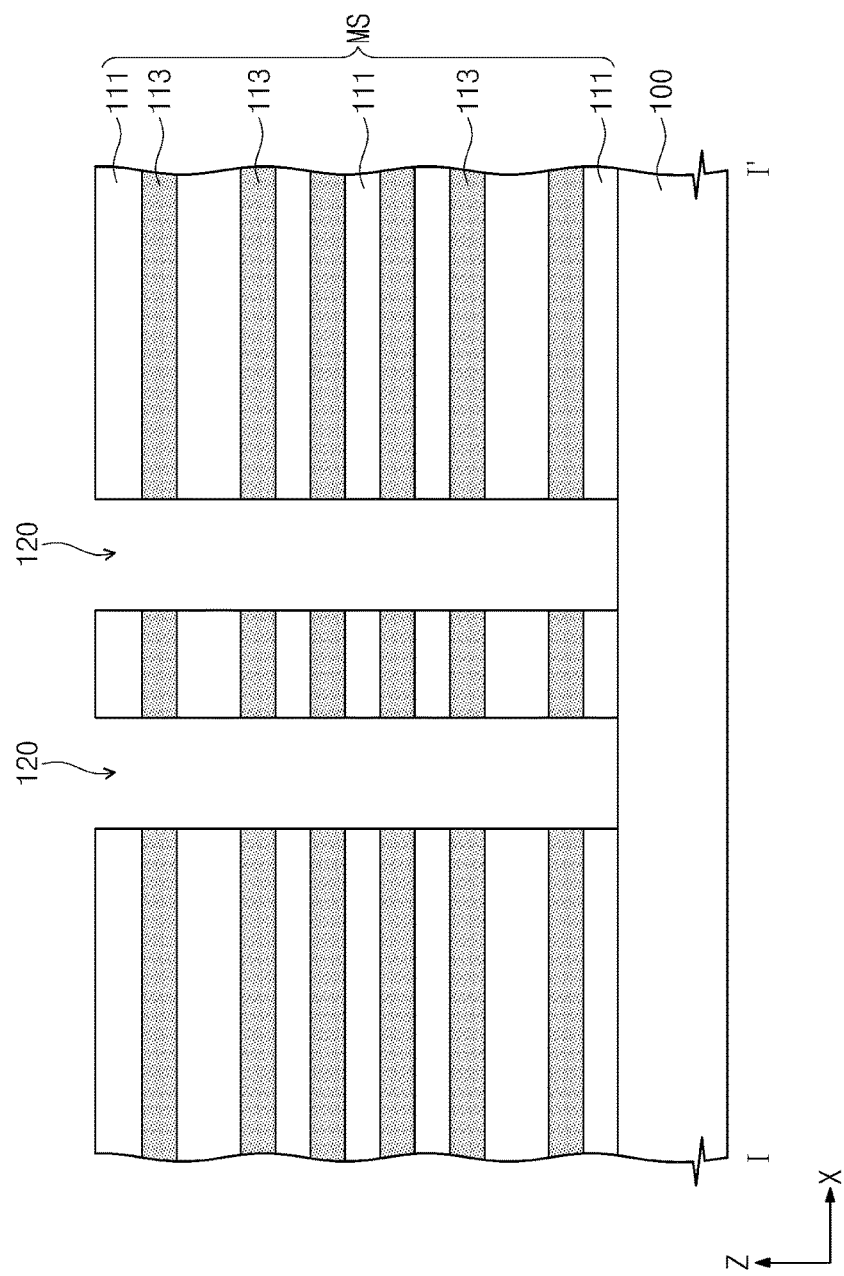

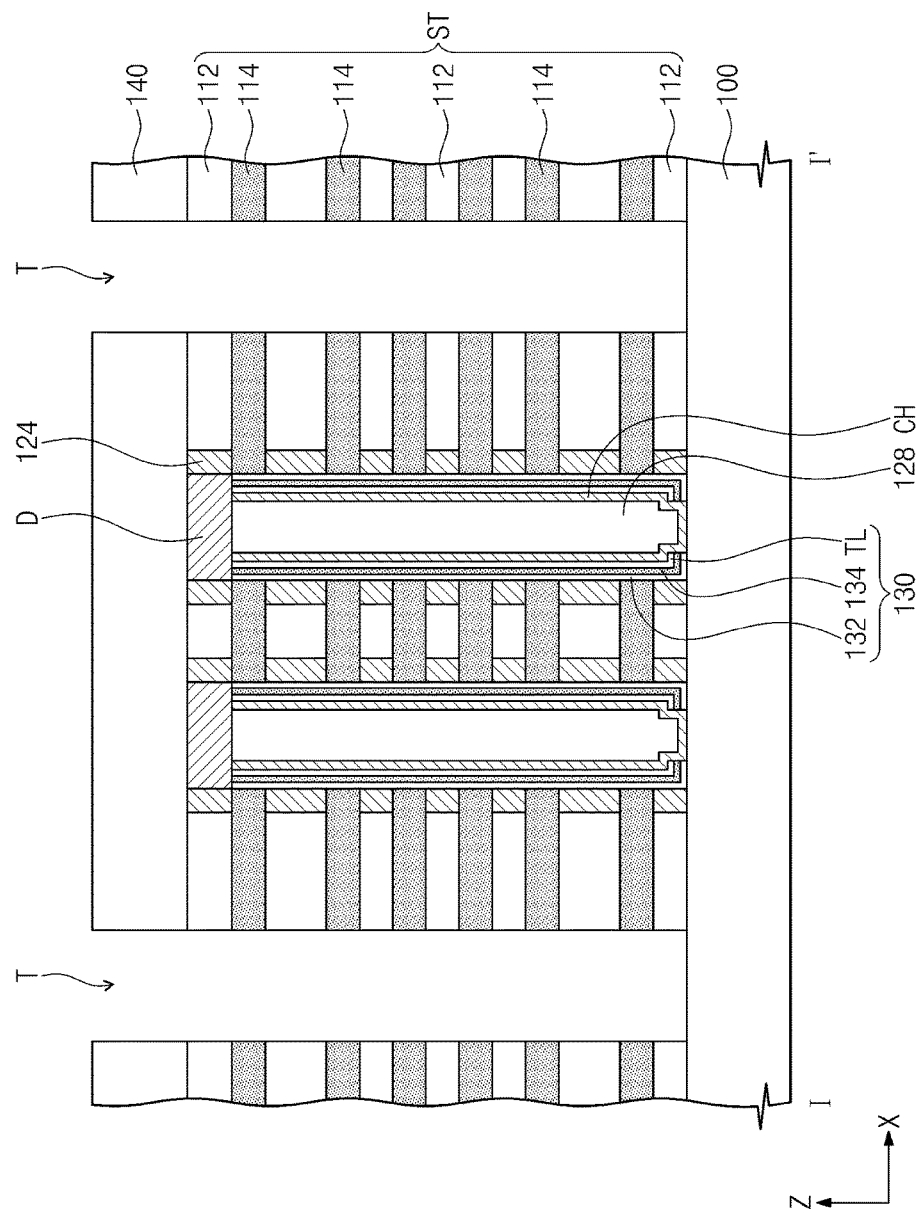

SEMICONDUCTOR MEMORY DEVICE

CROSS-REFERENCE TO RELATED APPLICATIONS

This U.S. non-provisional patent application claims priority under 35 U.S.C. § 119 to Korean Patent Application No. 10-2015-0122907, filed on Aug. 31, 2015, in the Korean Intellectual Property Office, the entire contents of which are hereby incorporated by reference.

BACKGROUND OF THE INVENTION

Exemplary implementations of the herein disclosed subject matter relate to semiconductor memory devices, and in particular, to three-dimensional nonvolatile memory devices.

Higher integration of semiconductor devices is required to satisfy consumer demands for superior performance and inexpensive prices. In the case of semiconductor devices, since their integration is an important factor in determining product prices, increased integration is especially required. In the case of typical two-dimensional or planar semiconductor devices, since their integration is mainly determined by the area occupied by a unit memory cell, integration is greatly influenced by the level of a fine pattern forming technology. However, the extremely expensive process equipment needed to increase pattern fineness sets a practical limitation on increasing integration for two-dimensional or planar semiconductor devices.

To overcome such a limitation, three-dimensional (3D) semiconductor devices including three-dimensionally-arranged memory cells have been proposed. However, there are significant manufacturing obstacles in achieving low-cost, mass-production of 3D semiconductor memory devices, particularly in the mass-fabrication of 3D devices that maintain or exceed the operational reliability of their 2D counterparts.

SUMMARY

Exemplary implementations of the herein disclosed subject matter provide semiconductor memory devices with improved reliability.

According to exemplary implementations, a semiconductor memory device may include a stack including gate electrodes stacked on a substrate in a vertical direction and insulating patterns interposed between the gate electrodes, vertical channels passing through the stack and connected to the substrate, a tunnel insulating layer enclosing each of the vertical channels, charge storing patterns provided between the tunnel insulating layer and the gate electrodes and spaced apart from each other in the vertical direction, and blocking insulating patterns provided between the charge storing patterns and the gate electrodes and spaced apart from each other in the vertical direction. The blocking insulating patterns may have a vertical thickness that is greater than that of the gate electrodes.

In some exemplary implementations, the vertical thickness of the blocking insulating patterns increases in a direction from the gate electrodes toward the charge storing patterns.

In some exemplary implementations, the charge storing patterns may have a vertical thickness increasing in a direction from the blocking insulating patterns toward the tunnel insulating layer.

In some exemplary implementations, the charge storing patterns may have a vertical thickness that is substantially equal to that of the blocking insulating patterns.

In some exemplary implementations, the charge storing patterns may have a vertical thickness that is greater than that of the blocking insulating patterns.

In some exemplary implementations, the vertical thickness of the blocking insulating patterns may be uniform.

In some exemplary implementations, the charge storing patterns may have a vertical thickness that is uniform and is smaller than that of the blocking insulating patterns.

In some exemplary implementations, the charge storing patterns may have a vertical thickness that is uniform and is substantially equal to that of the blocking insulating patterns.

In some exemplary implementations, the semiconductor memory device may further include horizontal insulating layers, which are provided between the gate electrodes and the blocking insulating patterns and extend to cover top and bottom surfaces of the gate electrodes. The insulating patterns may be extended through regions between the blocking insulating patterns adjacent to each other in the vertical direction and between the charge storing patterns adjacent to each other in the vertical direction to be in contact with the tunnel insulating layer. The insulating patterns may have a first vertical thickness between the horizontal insulating layers adjacent to each other in the vertical direction, a second vertical thickness between the blocking insulating patterns adjacent to each other in the vertical direction, and a third vertical thickness between the charge storing patterns adjacent to each other in the vertical direction. The first vertical thickness of the insulating patterns may be greater than the second vertical thickness of the insulating patterns, and the third vertical thickness of the insulating patterns may be greater than the second vertical thickness of the insulating patterns.

In some exemplary implementations, the semiconductor memory device may further include horizontal insulating layers, which are provided between the gate electrodes and the blocking insulating patterns and extend to cover top and bottom surfaces of the gate electrodes. The insulating patterns may be extended through regions between the blocking insulating patterns adjacent to each other in the vertical direction and between the charge storing patterns adjacent to each other in the vertical direction to be in contact with the tunnel insulating layer. The insulating patterns may have a first vertical thickness between the horizontal insulating layers adjacent to each other in the vertical direction, a second vertical thickness between the blocking insulating patterns adjacent to each other in the vertical direction, and a third vertical thickness between the charge storing patterns adjacent to each other in the vertical direction. The first vertical thickness of the insulating patterns may be greater than the second vertical thickness of the insulating patterns, and the second vertical thickness of the insulating patterns may be greater than the third vertical thickness of the insulating patterns.

According to exemplary implementations, a semiconductor memory device may include a stack including gate electrodes stacked on a substrate in a vertical direction and insulating patterns interposed between the gate electrodes, vertical channels passing through the stack and connected to the substrate, a tunnel insulating layer enclosing each of the vertical channels, charge storing patterns provided between the tunnel insulating layer and the gate electrodes and spaced apart from each other in the vertical direction, and blocking insulating patterns provided between the charge storing patterns and the gate electrodes and spaced apart from each other in the vertical direction. The blocking insulating patterns may have a vertical thickness increasing in a direction from the gate electrodes toward the charge storing patterns, and the charge storing patterns may have a vertical thickness increasing in a direction from the blocking insulating patterns toward the tunnel insulating layer.

In some exemplary implementations, the vertical thickness of the blocking insulating patterns may be greater than that of the gate electrodes.

In some exemplary implementations, the maximum of the vertical thickness of the blocking insulating patterns may be greater than the minimum of the vertical thickness of the charge storing patterns.

In some exemplary implementations, the maximum of the vertical thickness of the blocking insulating patterns may be substantially equal to the minimum of the vertical thickness of the charge storing patterns.

In some exemplary implementations, the insulating patterns may be extended through regions between the blocking insulating patterns adjacent to each other in the vertical direction and between the charge storing patterns adjacent to each other in the vertical direction to be in contact with the tunnel insulating layer. The insulating patterns positioned between the blocking insulating patterns and the charge storing patterns may have a vertical thickness decreasing in a direction toward the tunnel insulating layer.

BRIEF DESCRIPTION OF THE DRAWINGS exemplary implementations will be more clearly understood from the following brief description taken in conjunction with the accompanying drawings. The accompanying drawings represent non-limiting, exemplary implementations as described herein.

FIGS. 5A through 16A are plan views illustrating a method of fabricating a semiconductor memory device, according to exemplary implementations of the herein disclosed subject matter.

FIGS. 5B through 16B are sectional views, which are taken along line I-I' of FIGS. 5A through 16A, respectively, and are provided to illustrate a method of fabricating a semiconductor memory device.

Figure 1:
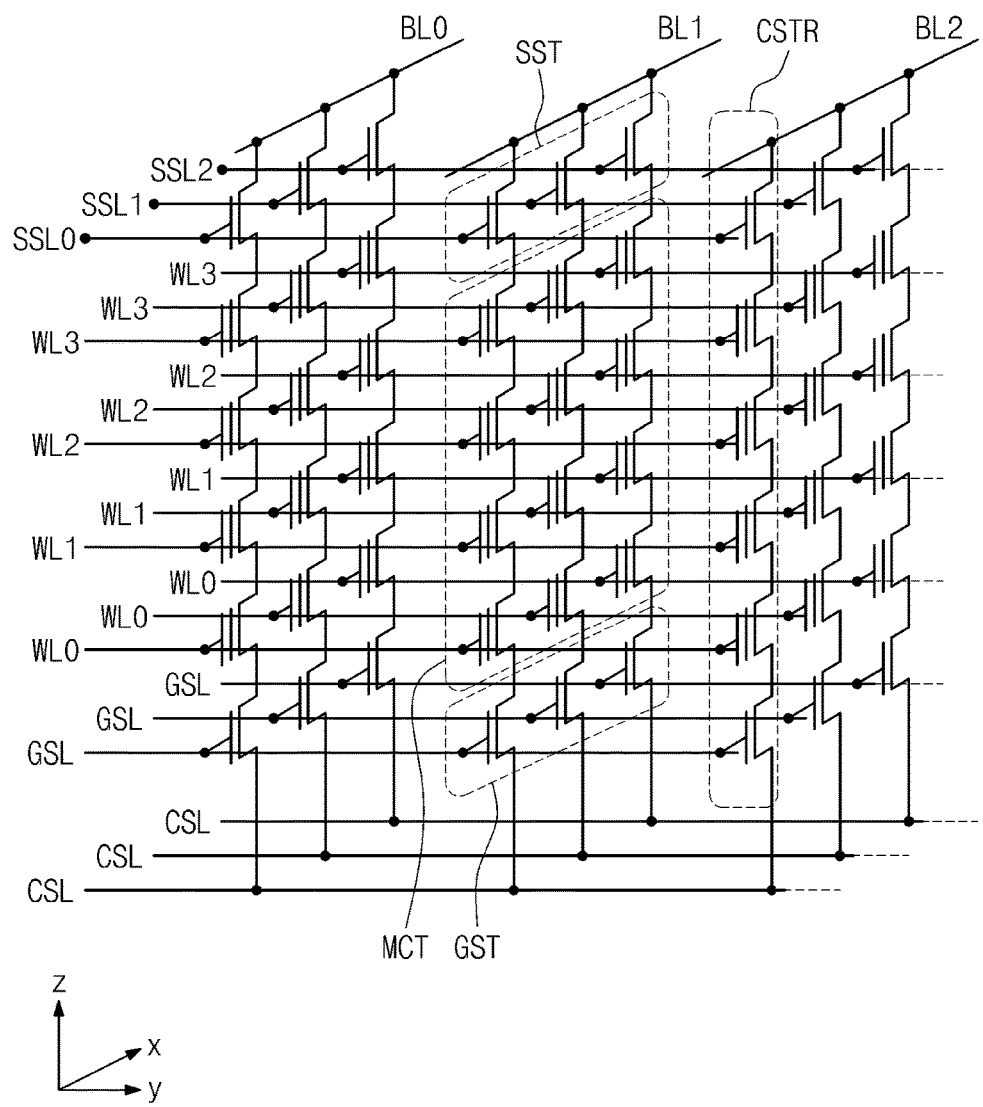
FIG. 1 is a schematic circuit diagram illustrating a cell array of a semiconductor memory device according to exemplary implementations of the herein disclosed subject matter.

It should be noted that these figures are intended to illustrate the general characteristics of methods, structure and/or materials utilized in certain exemplary implementations and to supplement the written description provided below. These drawings are not, however, to scale and may not precisely reflect the precise structural or performance characteristics of any given exemplary implementation, and should not be interpreted as defining or limiting the range of values or properties encompassed by exemplary implementations. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Exemplary implementations of the herein disclosed subject matter will now be described more fully with reference to the accompanying drawings, in which exemplary implementations are shown. Exemplary implementations may, however, be embodied in many different forms and should not be construed as being limited to the exemplary implementations set forth herein; rather, these exemplary implementations are provided so that this disclosure will be thorough and complete, and will fully convey the concept of exemplary implementations to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Exemplary implementations are described herein with reference to cross-sectional illustrations that are schematic illustrations of idealized implementations (and intermediate structures) of exemplary implementations. As such, variations from the shapes of the illustrations as a result, for example, of manufacturing techniques and/or tolerances, are to be expected. Thus, exemplary implementations should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of exemplary implementations.

As appreciated by the present inventive entity, devices and methods of forming devices according to various exemplary implementations described herein may be embodied in microelectronic devices such as integrated circuits, wherein a plurality of devices according to various exemplary implementations described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various exemplary implementations described herein may include a plurality of the devices in an array and/or in a two-dimensional pattern that is based on the functionality of the microelectronic device.

The devices according to various exemplary implementations described herein may be interspersed among other devices depending on the functionality of the microelectronic device. Moreover, microelectronic devices according to various exemplary implementations described herein may be replicated in a third direction that may be orthogonal to the two different directions, to provide three-dimensional integrated circuits.

Accordingly, the cross-sectional view(s) illustrated herein provide support for a plurality of devices according to various exemplary implementations described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Unless otherwise defined, all terms (including technical and scientific terms) used herein have the same meaning as commonly understood by one of ordinary skill in the art to which exemplary implementations belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a schematic circuit diagram illustrating a cell array of a semiconductor memory device according to exemplary implementations of the subject matter described herein.

As shown in FIG. 1, a semiconductor memory device according to exemplary implementations may include a common source line CSL, a plurality of bit lines BL0-BL2, and a plurality of cell strings CSTR disposed between the common source line CSL and the bit lines BL0-BL2.

The bit lines BL0-BL2 may be two-dimensionally arranged on the substrate and the plurality of the cell strings CSTR may be connected in parallel to each of the bit lines BL0-BL2. Accordingly, the cell strings CSTR may also be two-dimensionally arranged on the common source line CSL or the substrate.

Each of the cell strings CSTR may be configured to include a ground selection transistor GST connected to the common source line CSL, a string selection transistor SST connected to one of the bit lines BL0-BL2, and a plurality of memory cell transistors MCT disposed between ground and string selection transistors GST and SST. The ground selection transistor GST, the memory cell transistors MCT, and the string selection transistor SST constituting each of the cell strings CSTR may be serially connected to each other. Furthermore, a ground selection line GSL, a plurality of word lines WL0-WL3 and a plurality of string selection lines SSL0-SSL2 may be provided between the common source line CSL and the bit lines BL0-BL2 to serve as gate electrodes of the ground selection transistor GST, the memory cell transistors MCT, and the string selection transistors SST, respectively.

The gate electrodes of the ground selection transistor GST may be connected in common to the ground selection line GSL, thereby being in an equipotential state. Similarly, the gate electrodes of the memory cell transistors MCT located at the same level may also be connected in common to one of the word lines WL0-WL3, thereby being in an equipotential state. Since each of the cell strings CSTR includes a plurality of the memory cell transistors MCT disposed at different levels from each other, the word lines WL0-WL3 may have a multi-layered structure, between the common source line CSL and the bit lines BL0-BL2.

The ground and string selection transistors GST and SST and the memory cell transistors MCT may be metal-oxide-semiconductor field effect transistors (MOSFETs), in which the channel structures are used as channel regions. In certain embodiments, the channel structure, in conjunction with the ground selection line GSL, the word lines WL0-WL3, and the string selection lines SSL, may constitute metal-oxide-semiconductor (MOS) capacitors. In this case, if a voltage higher than a threshold voltage of the MOS capacitor is applied to the ground selection line GSL, the word lines WL0-WL3, and the string selection lines SSL, a fringe field may be produced to form an inversion layer between the word lines WL0-WL3, and such a formation of the inversion layer may allow the ground selection transistor GST, the memory cell transistors MCT, and the string selection transistor SST to be electrically connected to each other.

Figure 2:
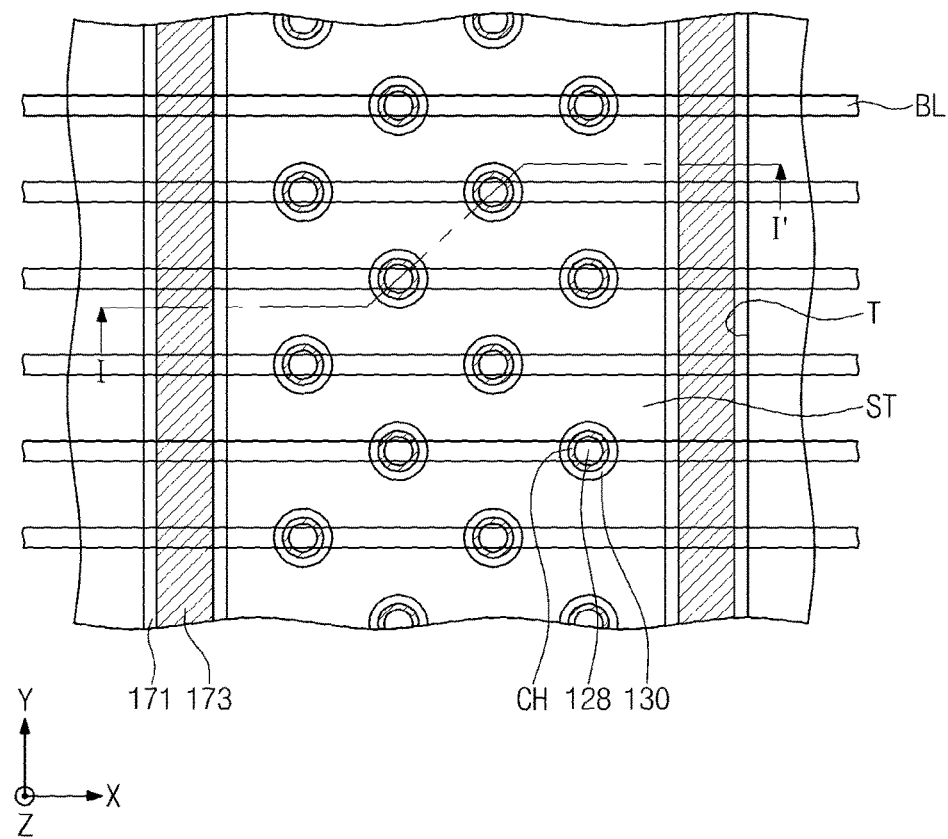
FIG. 2 is a plan view illustrating a semiconductor memory device according to exemplary implementations of the herein disclosed subject matter.
Figure 3A:
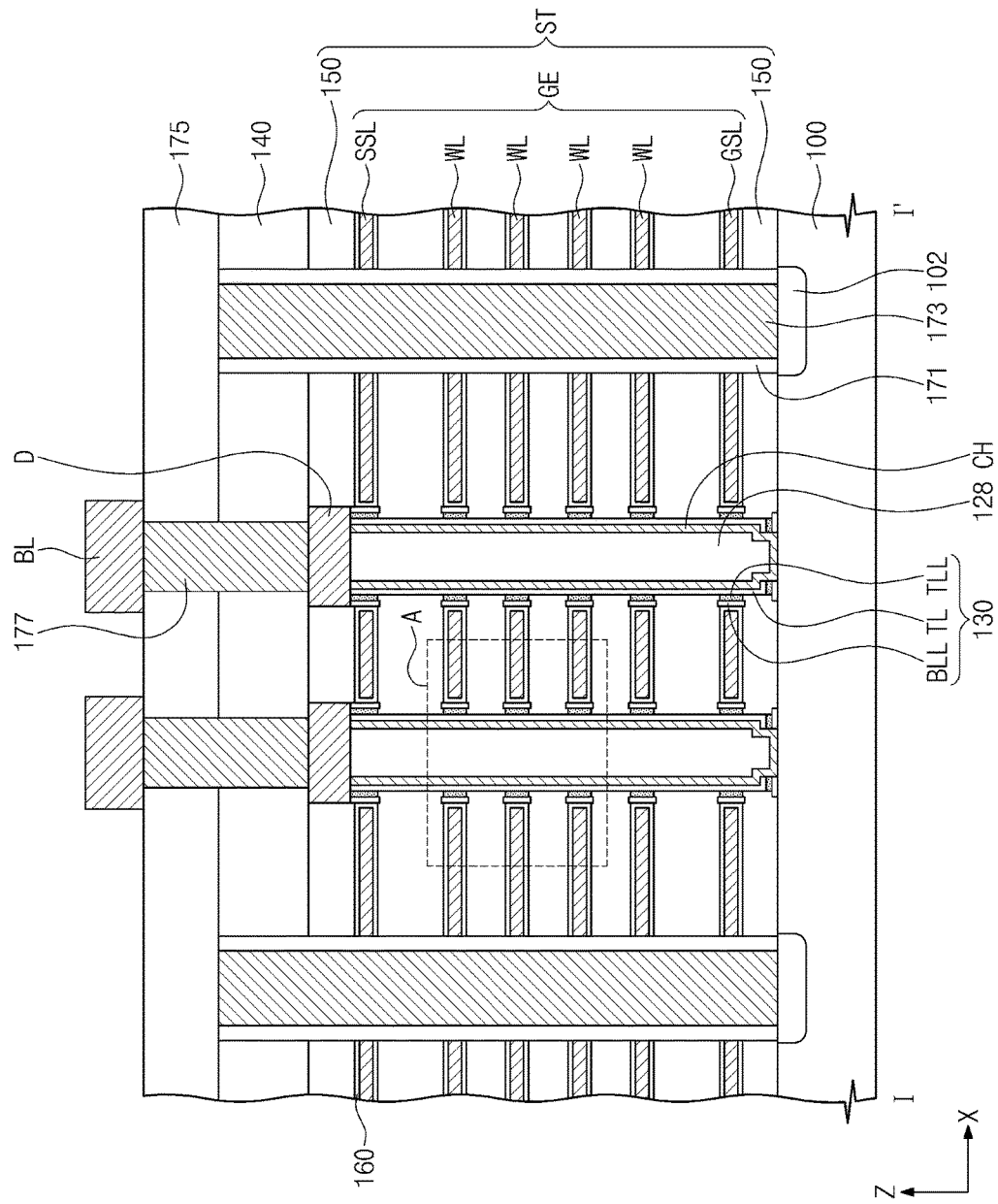
FIGS. 3A and 3B are sectional views, which are respectively taken along line I-I' of FIG. 2 and are provided to illustrate semiconductor memory devices according to exemplary implementations of the herein disclosed subject matter.
Figure 3B:
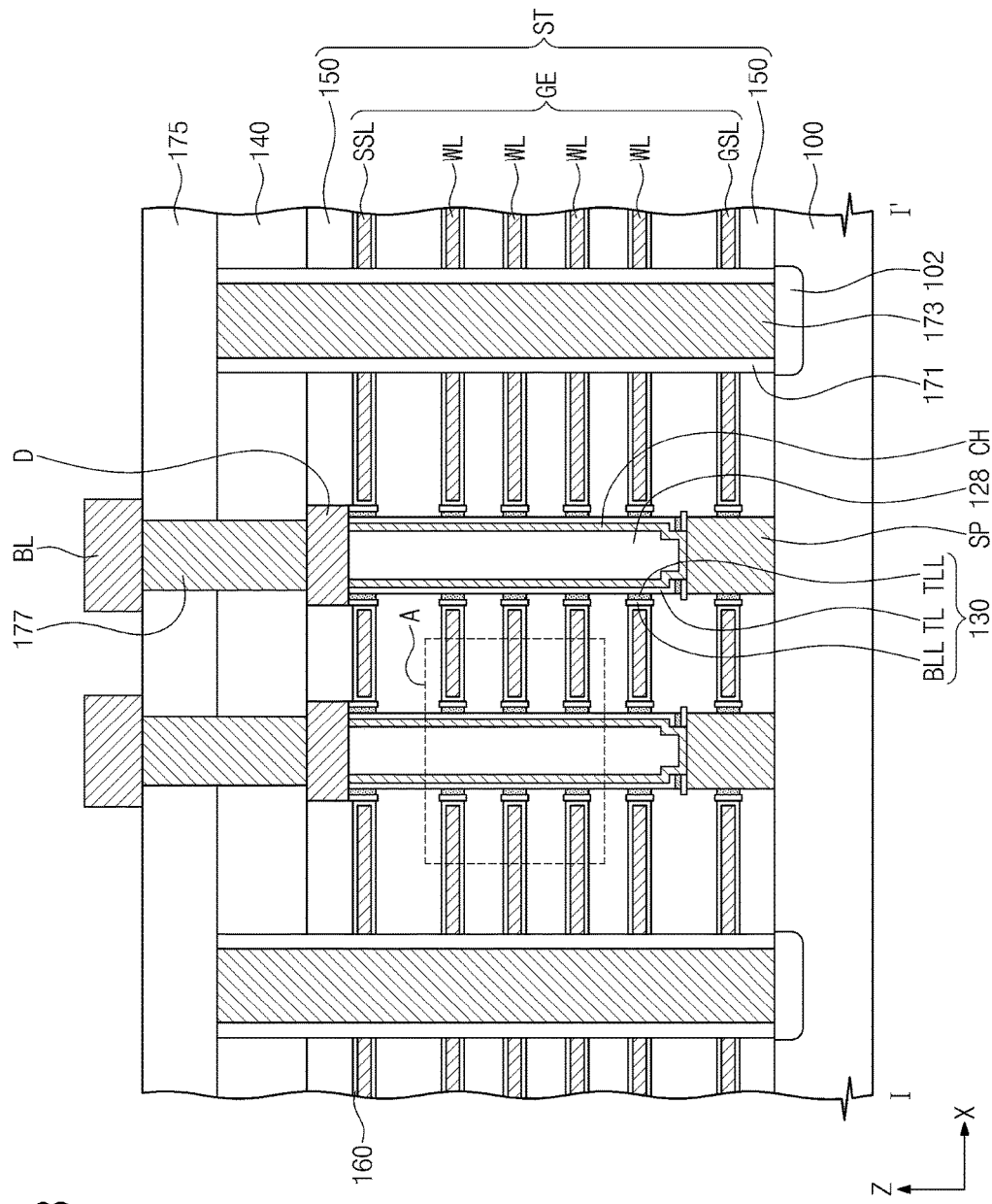

FIG. 2 is a plan view illustrating a semiconductor memory device according to exemplary implementations of the herein disclosed subject matter. FIGS. 3A and 3B are sectional views, which are respectively taken along line I-I' of FIG. 2 and are provided to illustrate semiconductor memory devices according to exemplary implementations of the herein disclosed subject matter. FIGS. 4A through 4D are enlarged views illustrating a portion 'A' of FIG. 3A or 3B.

As shown in FIGS. 2 and 3A, a plurality of stacks ST may be provided on a substrate 100. The stacks ST may be arranged along a first direction X. The substrate 100 may be a silicon substrate, a silicon-germanium substrate, a germanium substrate, or a single-crystalline epitaxial layer grown on a single-crystalline silicon substrate.

An impurity region 102 may be provided in or on the substrate 100. The impurity region 102 may be provided between the stacks ST and may extend in a second direction Y crossing the first direction X. The impurity region 102 may serve as the common source line CSL. In this case, the impurity region 102 may be provided to have a different conductivity type from that of the substrate 100.

Each of the stacks ST may include insulating patterns 150, which are stacked on the substrate 100 in a vertical direction Z normal to a top surface of the substrate 100, and gate electrodes GE, which are respectively interposed between the insulating patterns 150. For example, the insulating patterns 150 and the gate electrodes GE may be alternately and repeatedly stacked on the substrate 100.

The gate electrodes GE sequentially stacked on the substrate 100 may serve as the ground selection line GSL, the word lines WL, and the string selection line SSL in order enumerated. The gate electrodes GE may be formed of, or include, a conductive material. For example, the gate electrodes GE may include at least one of doped semiconductors (e.g., doped silicon and so forth), metals (e.g., tungsten, copper, aluminum, and so forth), conductive metal nitrides (e.g., titanium nitride, tantalum nitride, and so forth), or transition metals (e.g., titanium, tantalum, and so forth).

Thicknesses of the insulating patterns 150 may be variously changed, depending on technical features required for a semiconductor memory device. For example, the insulating pattern 150 disposed between the lowermost and next-lowermost ones of the gate electrodes GE and between the uppermost and next-uppermost ones of the gate electrodes GE may be thicker than the others of the insulating patterns 150. The insulating patterns 150 may be formed of, or include, silicon oxide.

Vertical channels CH may be provided to pass through the stack ST and may be connected to the substrate 100. When viewed in a plan view, the vertical channels CH may be arranged, in a line, parallel to the first direction X or in a zigzag manner and may be aligned to each other in the second direction Y. Bottom surfaces of the vertical channels CH may be in contact with the top surface of the substrate 100, and sidewalls of the vertical channels CH may extend from the bottom surfaces of the vertical channels CH in a vertical direction Z to face sidewalls of the gate electrodes GE and the insulating patterns 150. The vertical channels CH may have a hollow-pipe, cylinder, or cup shape. The vertical channels CH may be formed of, or include, one of a poly silicon layer, an organic semiconductor layer, or a carbon nano structure.

As shown in FIG. 3B, a semiconductor pillar SP may be further disposed between the substrate 100 and the vertical channels CH. The semiconductor pillar SP may be grown from the substrate 100 by a selective epitaxial growth process, in which the substrate 100 in contact with the vertical channels CH is used as a seed layer. The semiconductor pillar SP may be formed of, or include, an intrinsic semiconductor material or a p-type semiconductor material.

FIGS. 3A and 3B show that a charge storing structure 130 may be disposed between the vertical channels CH and the stacks ST. When viewed in a sectional view, the charge storing structure 130 may be disposed between the gate electrodes GE and the vertical channels CH. When viewed in a plan view, the charge storing structure 130 may be provided to enclose each of the vertical channels CH.

The charge storing structure 130 may include tunnel insulating layers TL, charge storing patterns TLL, and blocking insulating patterns BLL. The tunnel insulating layers TL may be provided to enclose the vertical channels CH and extend along sidewalls of the vertical channels CH or in the vertical direction Z. The tunnel insulating layer TL may be tubular and have a hollow-pipe shape. The tunnel insulating layer TL may be formed of, or include, a silicon oxide layer.

The charge storing pattern TLL may be disposed between the tunnel insulating layer TL and the gate electrode GE. The charge storing patterns TLL may be spaced apart from each other in the vertical direction Z by the insulating patterns 150. Neighboring ones of the charge storage patterns TLL may not be formed from a continuous charge storing material layer. Each of the charge storing patterns TLL may associated with a different word line WL and formed as discrete, isolated portions of a charge storing material layer. For example, each of the charge storing patterns TLL may be formed as a ring shape, with an inner surface of the ring shaped charge storing pattern TLL surrounding (and may be in contact with) the tunnel insulating layer TL and an outer surface of the ring shaped charge storing pattern TLL facing its associated word line WL. Top and bottom surfaces of the ring shaped charge storing pattern TLL may face (and may be in contact with) respective ones of insulating patterns 150. Since the charge storing patterns TLL are spaced apart from each other in the vertical direction Z, it is possible to suppress electric charges trapped in the charge storing patterns TLL from being diffused or spread into others of the charge storing patterns TLL. For example, the charge storing patterns TLL may be formed of, or include, a silicon nitride layer.

Neighboring ones of the blocking insulating pattern BLL may not be formed from a continuous blocking insulating material layer. Each of the blocking insulating pattern BLL may associated with a different word line WL and formed as discrete, isolated portions of a blocking insulating material layer. For example, each of the blocking insulating patterns BLL may be formed as a ring shape, with an inner surface of the ring shaped blocking insulating pattern BLL surrounding (and may be in contact with) the outer surface of the ring shaped charge storing pattern TLL, and an outer surface of the ring shaped blocking insulating pattern BLL facing its associated word line WL. Top and bottom surfaces of the ring shaped blocking insulating pattern BLL may face (and may be in contact with) respective ones of insulating patterns 150. The shape of the ring shaped blocking insulating patterns BLL and ring shaped charge storing pattern TLL may be similar and need not be cylindrical (e.g., they may be oval, elliptical, rectangular, square, etc.).

A horizontal insulating layer 160 may be provided between the gate electrodes GE and the blocking insulating patterns BLL, and moreover, it may be laterally extended to cover top and bottom surfaces of the gate electrodes GE. The horizontal insulating layer 160 may be in contact with the blocking insulating patterns BLL. The horizontal insulating layer 160 may include a layer or a plurality of layers. In certain embodiments, the horizontal insulating layer 160 may be used as a part of a blocking insulating layer of a charge-trapping-type nonvolatile memory transistor.

As shown in FIGS. 4A through 4D, for the blocking insulating pattern BLL and the charge storing pattern TLL, there may be many variations in terms of thickness and shape. Firstly, a vertical thickness T1 may be defined as a distance along a line extending in the vertical direction (e.g., perpendicular to the substrate) between top and bottom surfaces of the blocking insulating patterns BLL in contact with the insulating patterns 150. A vertical thickness T2 may be defined as a distance along a line extending in the vertical direction (e.g., perpendicular to the substrate) between top and bottom surfaces, which are in contact with the insulating patterns 150, of the charge storing pattern TLL. A distance BT may be defined as a distance along a line extending in the vertical direction (e.g., perpendicular to the substrate) between the insulating patterns 150 adjacent to each other in the vertical direction Z.

The minimum of the vertical thickness T1 of each of the blocking insulating patterns BLL may be greater than a vertical distance of a vertical section of a horizontal insulating layer 160 that contacts the blocking insulating pattern BLL. The minimum of the vertical thickness T1 of each of the blocking insulating patterns BLL may be greater than the maximum of the vertical thickness of either the neighboring corresponding gate electrode GE.

The vertical thickness T2 of the charge storing pattern TLL may increase in a direction from the blocking insulating patterns BLL toward the tunnel insulating layer TL. Here, the minimum of the vertical thickness T2 of the charge storing pattern TLL may be substantially equal to or smaller than the distance BT between the insulating patterns 150. The minimum of the vertical thickness T2 of the charge storing pattern TLL may be smaller than the maximum of the vertical thickness T1 of the blocking insulating patterns BLL (e.g., T2<T1).

Figure 4A:
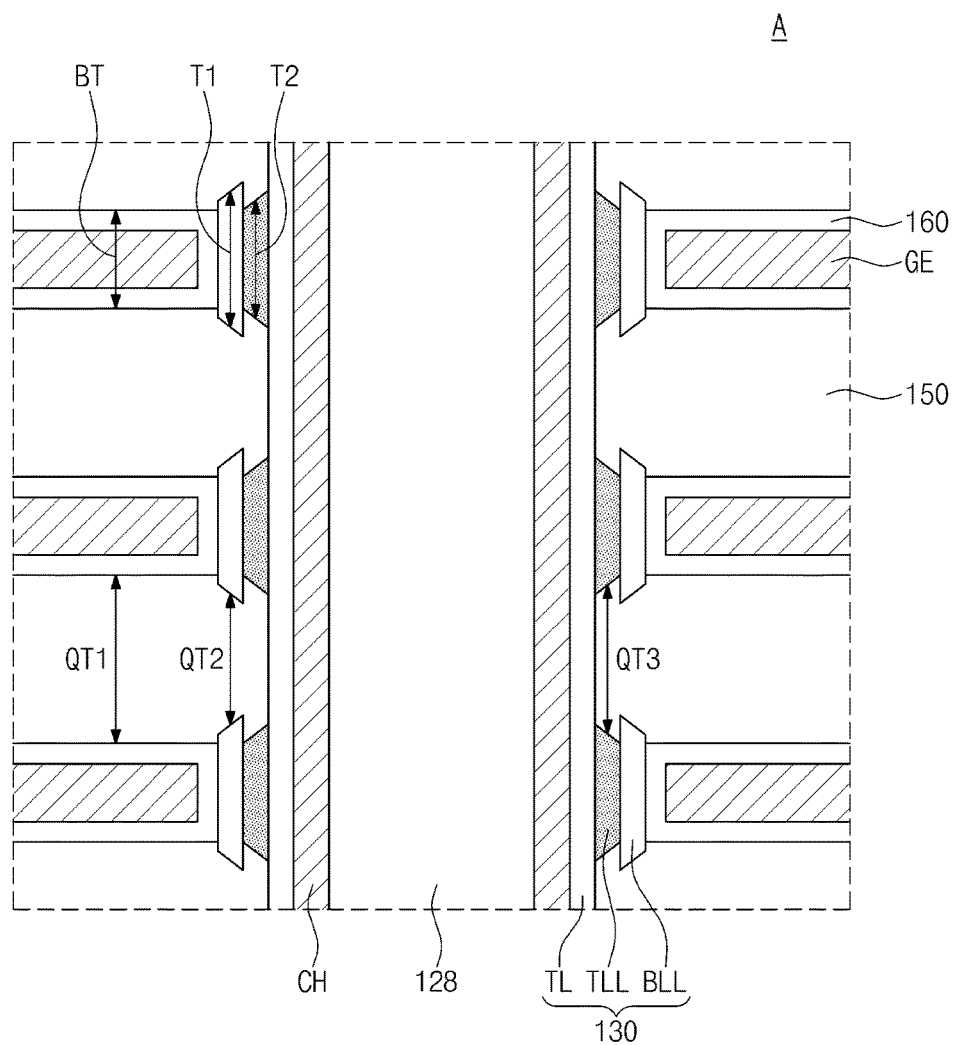
FIGS. 4A through 4D are enlarged views illustrating a portion 'A' of FIG. 3A or 3B.
Figure 4B:
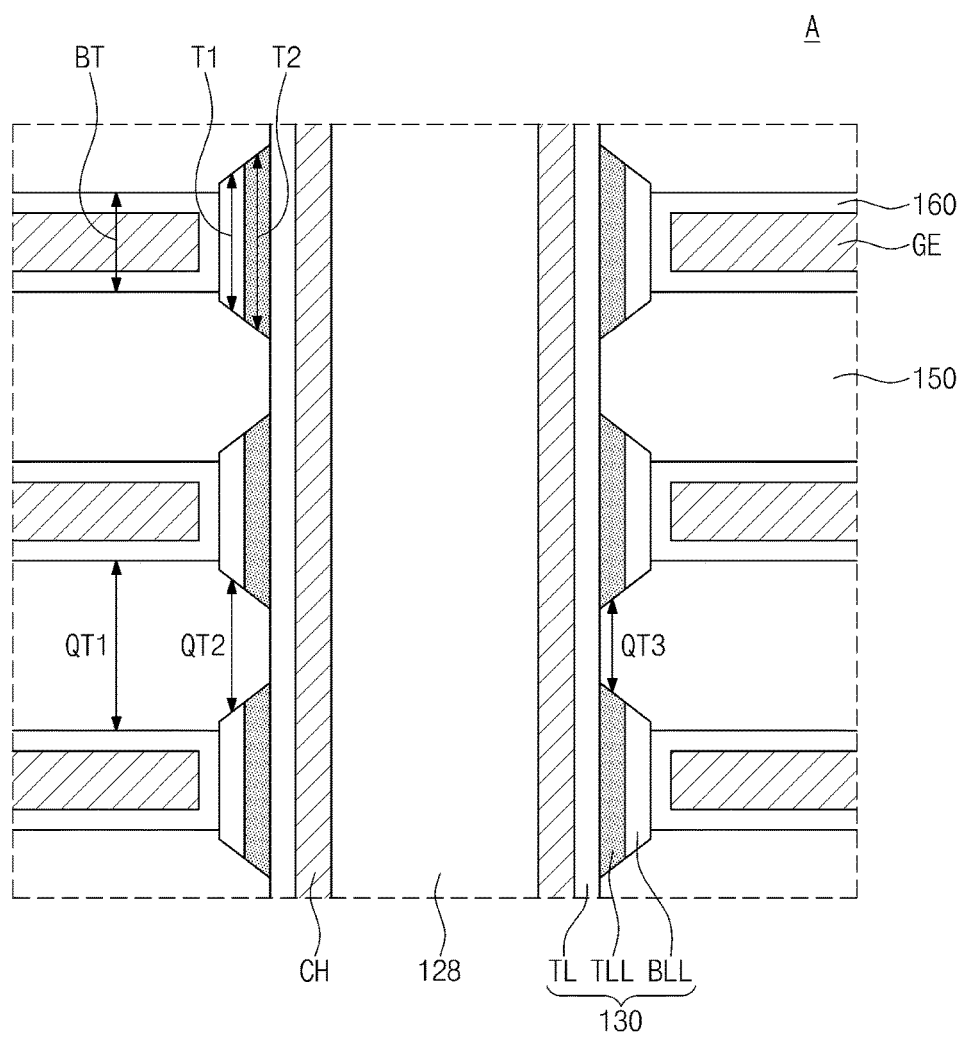

As shown in FIG. 4B, the vertical thickness T1 of the blocking insulating patterns BLL may increase in a direction from the gate electrodes GE toward the charge storing patterns TLL. Here, the minimum of the vertical thickness T1 of the blocking insulating patterns BLL may be greater than the distance BT between the insulating patterns 150 (e.g., BT<T1). In other words, the minimum of the vertical thickness T1 of the blocking insulating patterns BLL may be greater than the vertical thickness of the gate electrode GE.

In the embodiments of FIGS. 4A and 4B, the upper and lower surfaces of the charge storing patterns TLL and blocking insulating patterns BLL may slope towards the corresponding gate electrode GE.

Figure 4C:
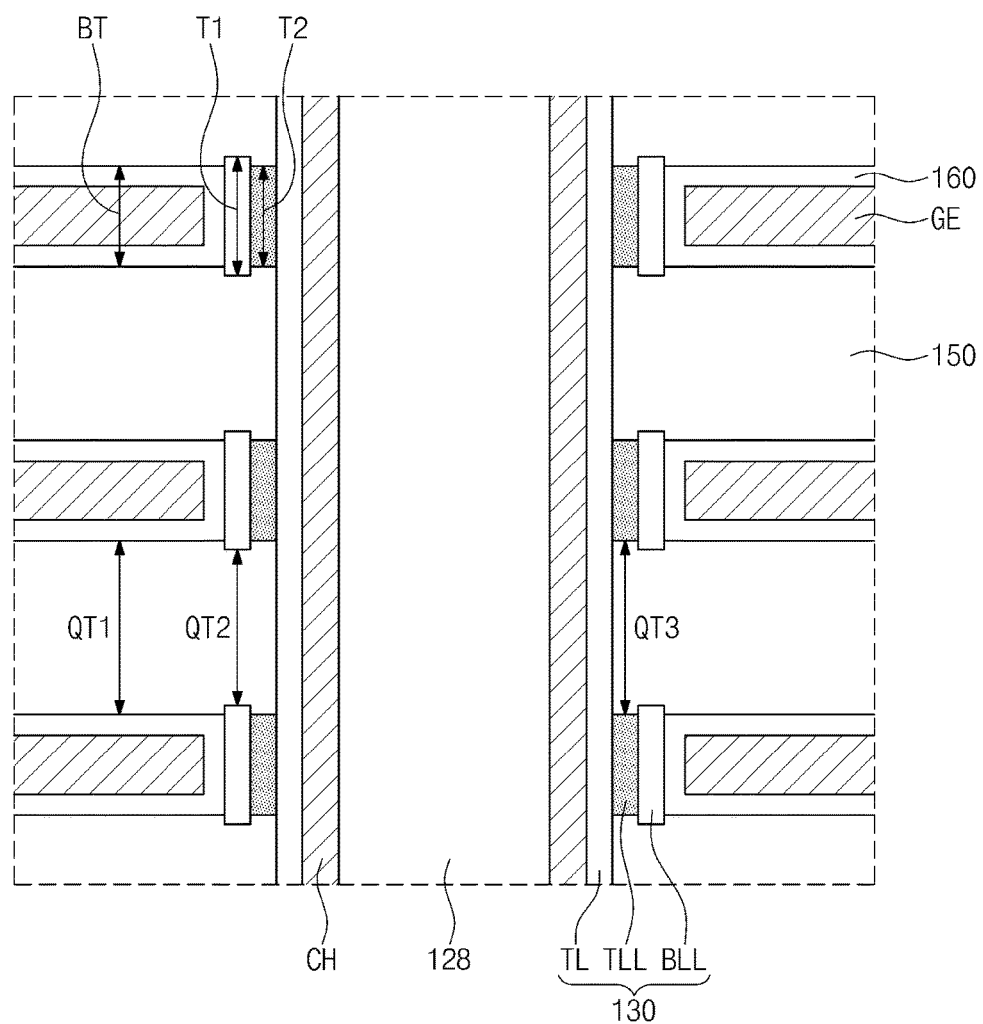

As shown in FIG. 4C, the vertical thickness T1 of the blocking insulating patterns BLL may be substantially uniform. The vertical thickness T1 of the blocking insulating patterns BLL may be greater than the distance BT between the insulating patterns 150. In other words, the vertical thickness T1 of the blocking insulating patterns BLL may be greater than the vertical thickness of the gate electrode GE.

The vertical thickness T2 of the charge storing patterns TLL may be substantially uniform. The vertical thickness T2 of the charge storing patterns TLL may be substantially the same as the distance BT between the insulating patterns 150 (i.e., T2=BT) and may be smaller than the vertical thickness T1 of the blocking insulating patterns BLL (i.e., T2<T1).

Figure 4D:
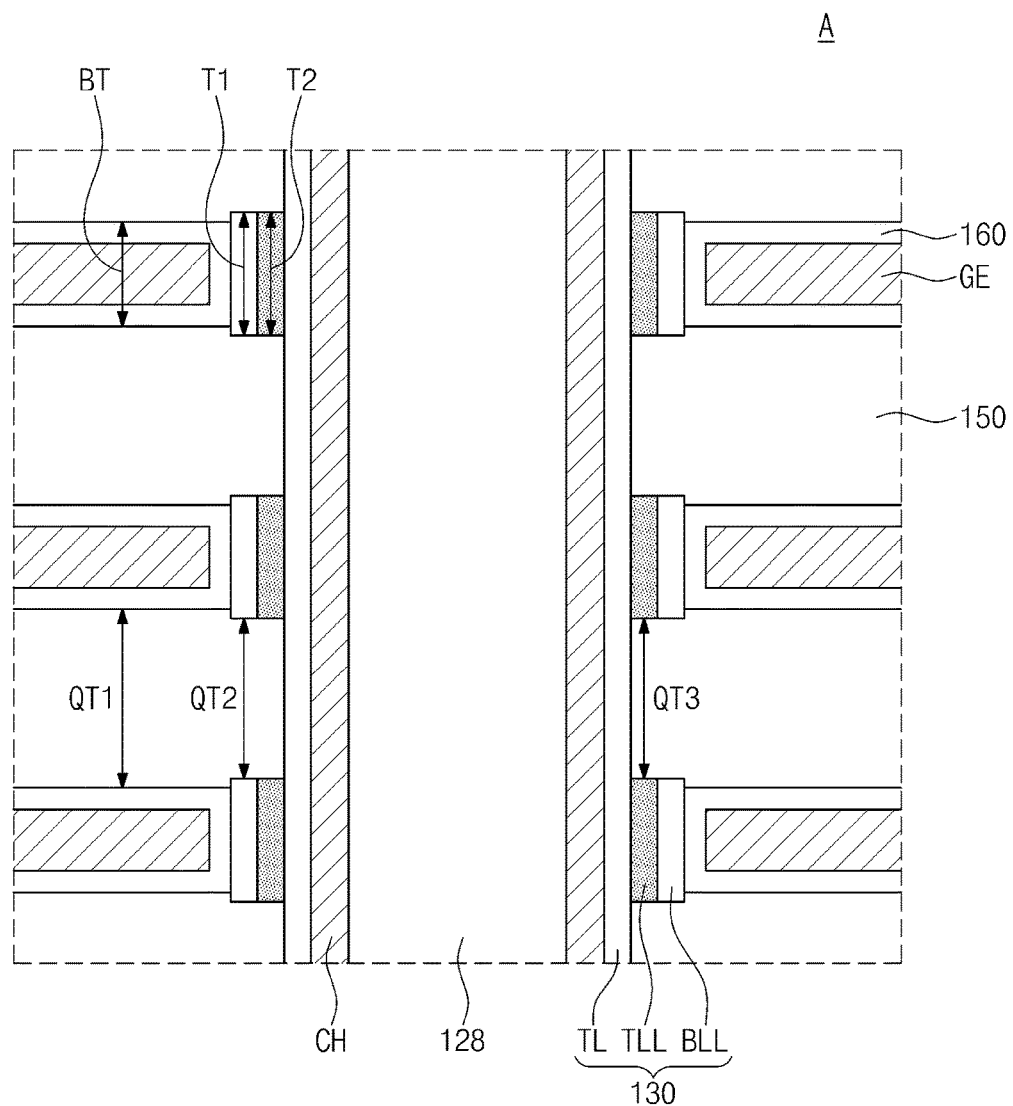

As shown in FIG. 4D, the vertical thicknesses T1 and T2 of the blocking insulating patterns BLL and the charge storing patterns TLL may be substantially uniform. The vertical thicknesses T1 and T2 of the blocking insulating patterns BLL and the charge storing patterns TLL may be substantially the same (i.e., T1=T2). The vertical thicknesses T1 and T2 of the blocking insulating patterns BLL and the charge storing patterns TLL may be greater than the distance BT between the insulating patterns 150 (i.e., T1>BT and T2>BT). In other words, the vertical thicknesses T1 and T2 of the blocking insulating patterns BLL and the charge storing patterns TLL may be greater than the vertical thickness of the gate electrode GE.

The insulating patterns 150 may extend to be in contact with the tunnel insulating layer TL through a region between vertically adjacent pairs of the blocking insulating patterns BLL and between vertically adjacent pairs of the charge storing patterns TLL. Here, since the insulating pattern 150 is disposed between several layers adjacent to each other in the vertical direction Z, there may be a horizontal-position-dependent variation in vertical thickness of the insulating pattern 150.

As shown in FIGS. 4A through 4D, the insulating pattern 150 may have a first thickness QT1 between the horizontal insulating layers 160 adjacent to each other in the vertical direction Z, a second thickness QT2 between the blocking insulating patterns BLL adjacent to each other in the vertical direction Z, and a third thickness QT3 between the charge storing patterns TLL adjacent to each other in the vertical direction Z.

As shown in FIG. 4A, the first thickness QT1 may be greater than the maximum of the second thickness QT2, and the maximum of the third thickness QT3 may be substantially equal to the maximum of the second thickness QT2.

As shown in FIG. 4B, the first thickness QT1 may be greater than the second thickness QT2, and the second thickness QT2 may be greater than the third thickness QT3 (i.e., QT1>QT2>QT3). In other words, the insulating patterns 150 may have a vertical thickness gradually decreasing in a horizontal direction toward the tunnel insulating layer TL.

As shown in FIG. 4C, the first thickness QT1 may be greater than the second thickness QT2 (i.e., QT2<QT1), and the third thickness QT3 may be greater than the second thickness QT2 (i.e., QT3<QT2).

As shown in FIG. 4D, the first thickness QT1 may be greater than the second thickness QT2 and the second and third thicknesses QT2 and QT3 may be substantially the same (i.e., QT1<QT2=QT3).

With respect to FIG. 3A, gap-fill patterns 128 may be provided to pass through the stacks ST and to fill empty gaps in the vertical channels CH. The gap-fill pattern 128 may be enclosed by the vertical channel CH. The gap-fill pattern 128 may be formed of, or include, at least one of insulating materials (e.g., silicon oxide or silicon nitride).

A pad D may be provided on the vertical channel CH, the gap-fill pattern 128, and the charge storing structure 130. The pad D may be in directly contact with the vertical channels CH. The pad D may be a semiconductor pattern, which is doped to have a different conductivity type from the substrate 100. For example, the pad D may be an n-type silicon pattern. The pad D may be used as a drain electrode of the cell string CSTR.

A mask pattern 140 may be disposed on the stacks ST. The mask pattern 140 may be provided to cover top surfaces of the uppermost one of the insulating patterns 150 and the pads D.

A conductive layer 173 may be provided between the stacks ST and may be connected to the impurity region 102. The conductive layer 173 may extend along the impurity region 102 or in the second direction Y to have a linear shape or a rectangular shape in a plan view. The conductive layer 173 may be formed of, or include, metals (e.g., tungsten, copper, or aluminum) or transition metals (e.g., titanium or tantalum). Spacers 171 may be interposed between the conductive layer 173 and the stacks ST. The spacer 171 may include at least one of insulating materials (e.g., silicon oxide or silicon nitride).

An interlayered insulating layer 175 may be provided on the mask pattern 140. The interlayered insulating layer 175 may be provided to cover top surfaces of the mask pattern 140 and the conductive layer 173. The interlayered insulating layer 175 may include at least one of insulating materials (e.g., silicon oxide, silicon nitride, and silicon oxynitride).

A contact plug 177 may be provided to pass through the interlayered insulating layer 175 and to be in contact with the pad D. The contact plug 177 may be formed of, or include, doped silicon or metallic materials (e.g., tungsten (W), copper (Cu), or aluminum (Al)). Bit lines BL may be provided on the interlayered insulating layer 175. Each of the bit lines BL may cross over the stacks ST and may be disposed on the contact plugs 177 to connect the vertical channels CH, which are arranged in the first direction X, to each other. The bit lines BL may be formed of, or include, a conductive material.

Figure 17:
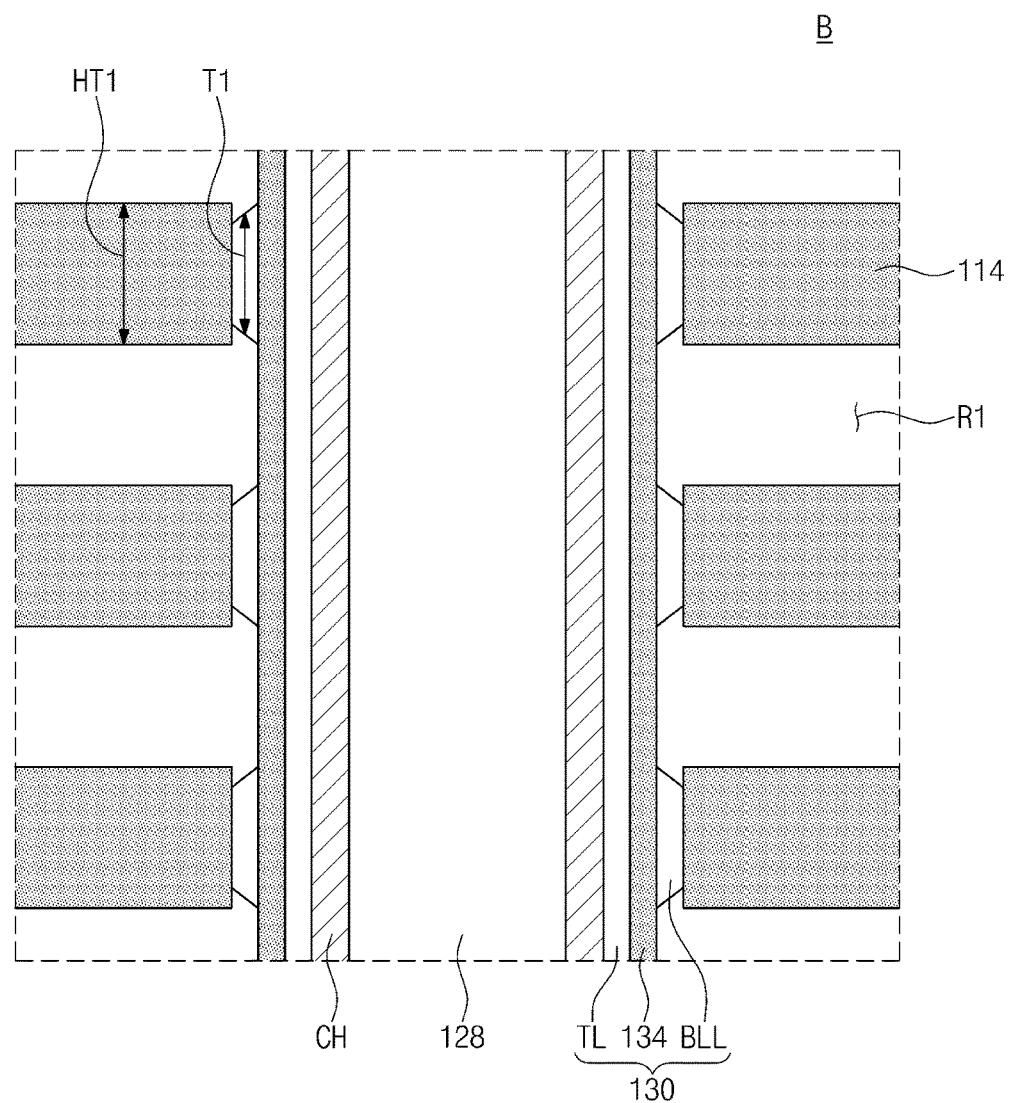
FIGS. 17 through 19 are enlarged views illustrating a portion 13' of FIG. 14B.
Figure 18:
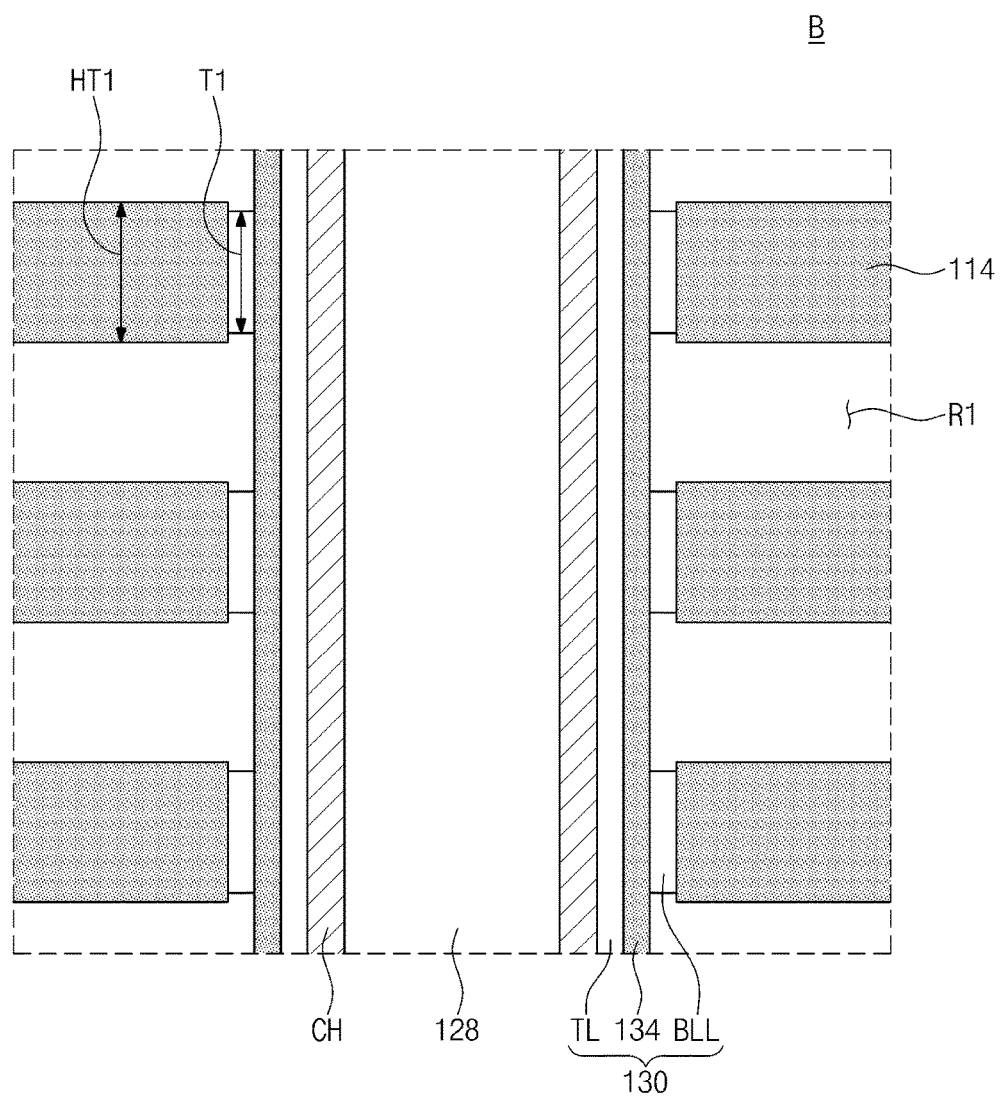
Figure 19:
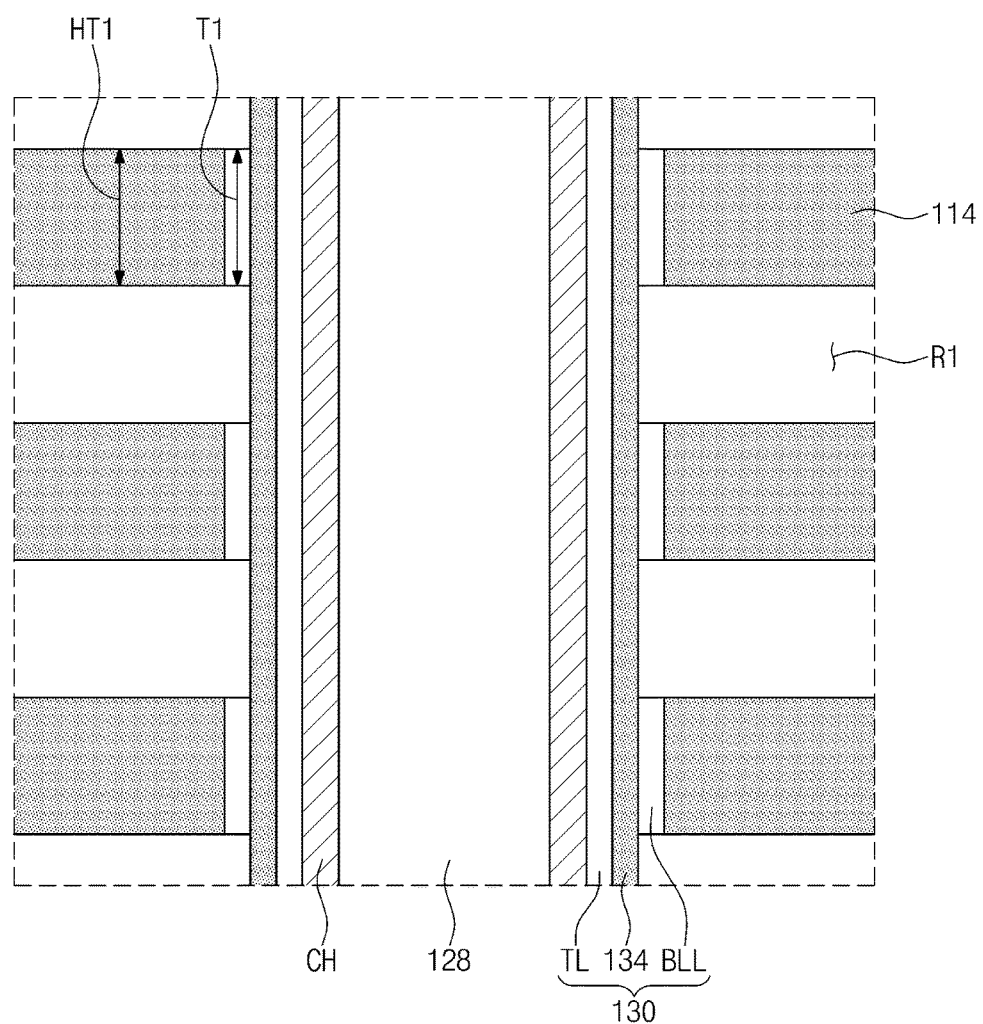

FIGS. 5A through 16A are plan views illustrating a method of fabricating a semiconductor memory device, according to exemplary implementations of the herein disclosed subject matter. FIGS. 5B through 16B are sectional views, which are taken along line I-I' of FIGS. 5A through 16A, respectively, and are provided to illustrate a method of fabricating a semiconductor memory device. FIGS. 17 through 19 are enlarged views illustrating a portion 'B' of FIG. 14B. FIGS. 20 through 23 are enlarged views illustrating a portion 'C' of FIG. 15B.

Figure 5A:
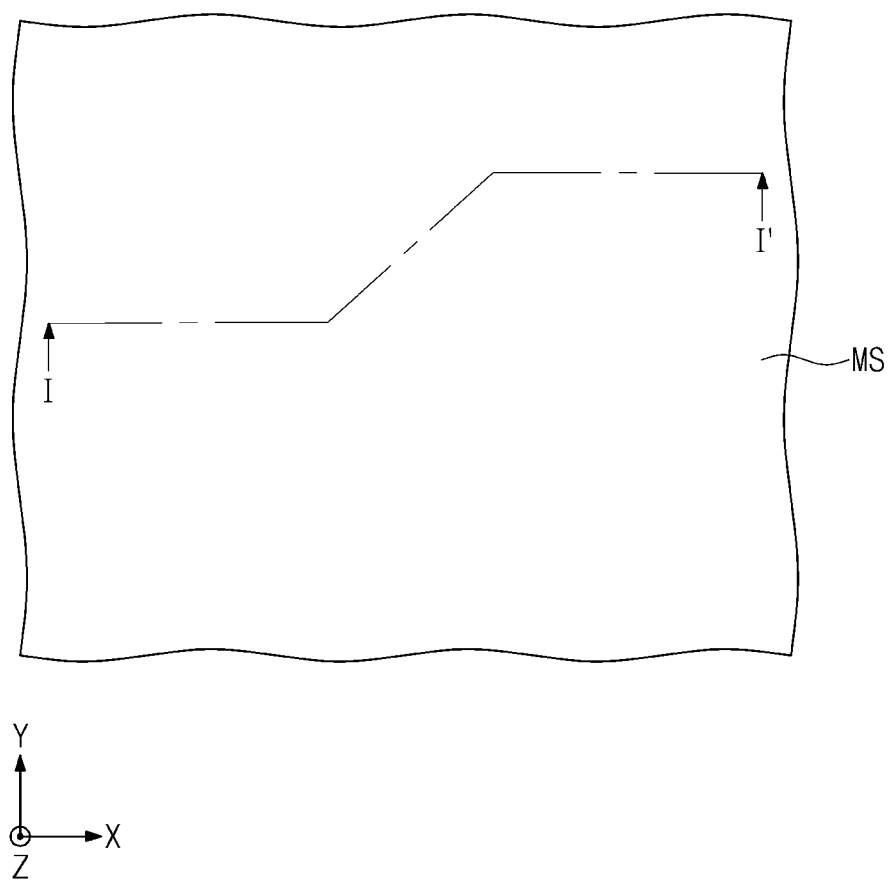

As shown in FIGS. 5A and 5B, the substrate 100 with a cell array region may be provided. A molding structure MS may be formed on the substrate 100. The molding structure MS may include insulating layers 111 and sacrificial layers 113, which are alternatingly and repeatedly stacked on the substrate 100. The insulating layers 111 may include a material having an etch selectivity with respect to the sacrificial layers 113. For example, the insulating layers 111 may be formed of silicon oxide and the sacrificial layers 113 may be formed of silicon nitride.

Figure 6A:
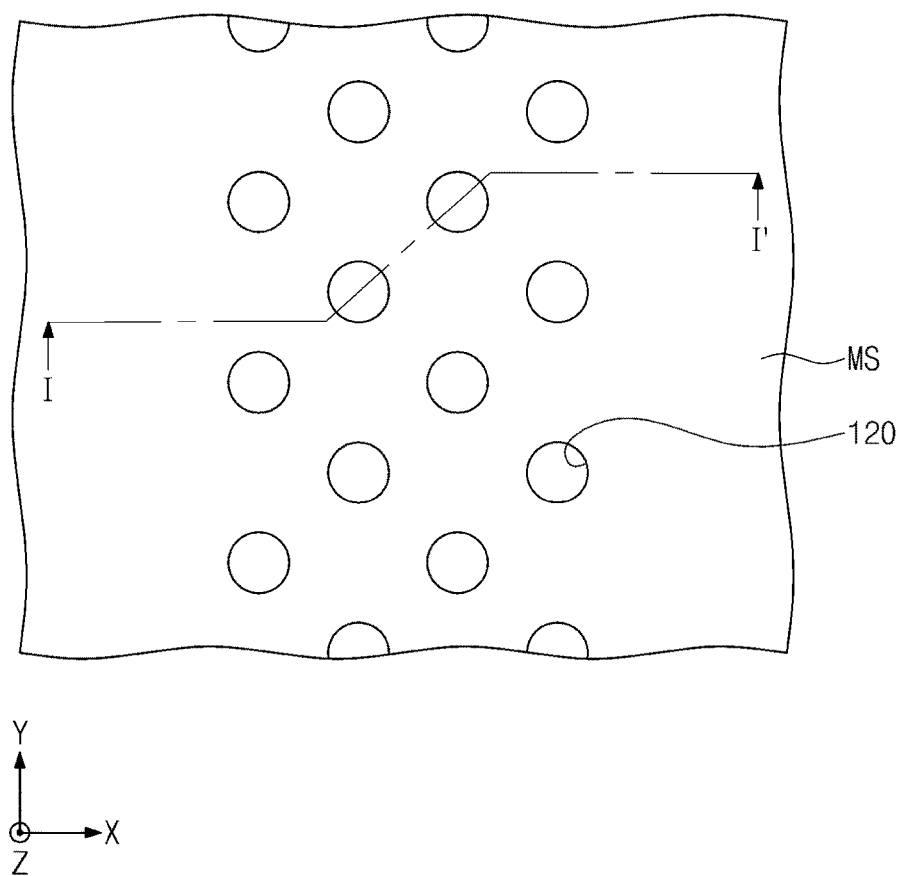

As shown in FIGS. 6A and 6B, the molding structure MS may be patterned to form channel holes 120. The formation of the channel holes 120 may include forming a mask pattern (not shown) on the molding structure MS and etching the molding structure MS exposed by the mask pattern. The etching process for forming the channel holes 120 may be performed to expose the top surface of the substrate 100. Although not illustrated in the drawings, the etching process may be performed in an over-etching manner, and in this case, the top surface of the substrate 100 may be partially recessed. The channel holes 120 may be spaced apart from each other in the first direction X and may be disposed to form a zigzag or linear arrangement, and moreover, the channel holes 120 may be aligned to each other in the second direction Y crossing the first direction X.

Figure 7A:
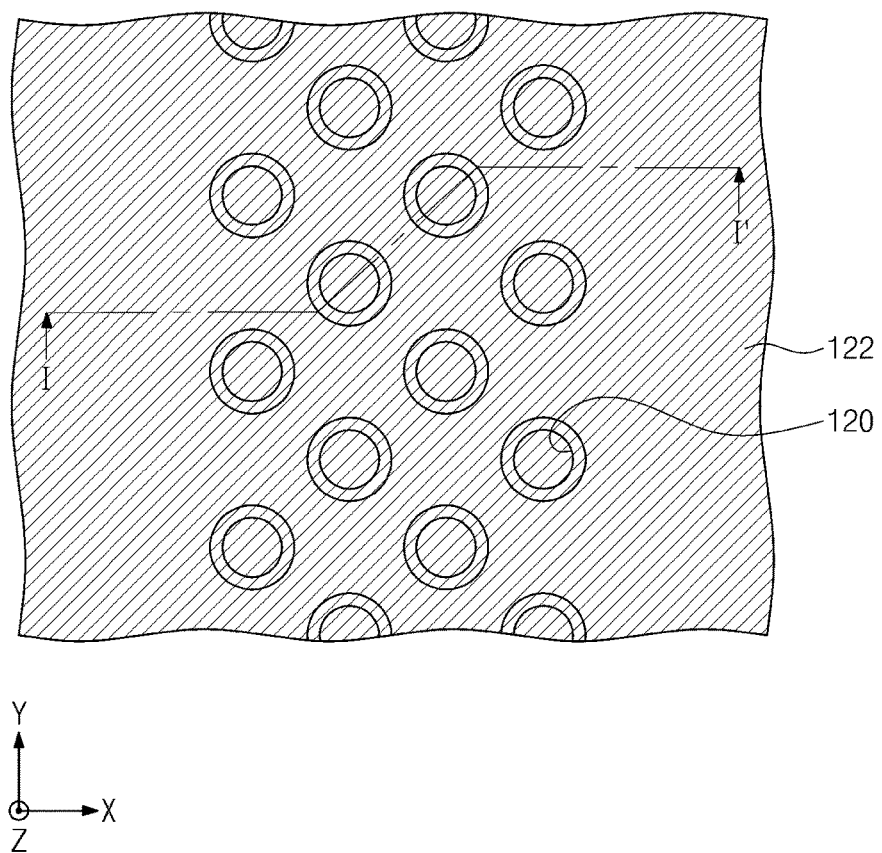
Figure 7B:
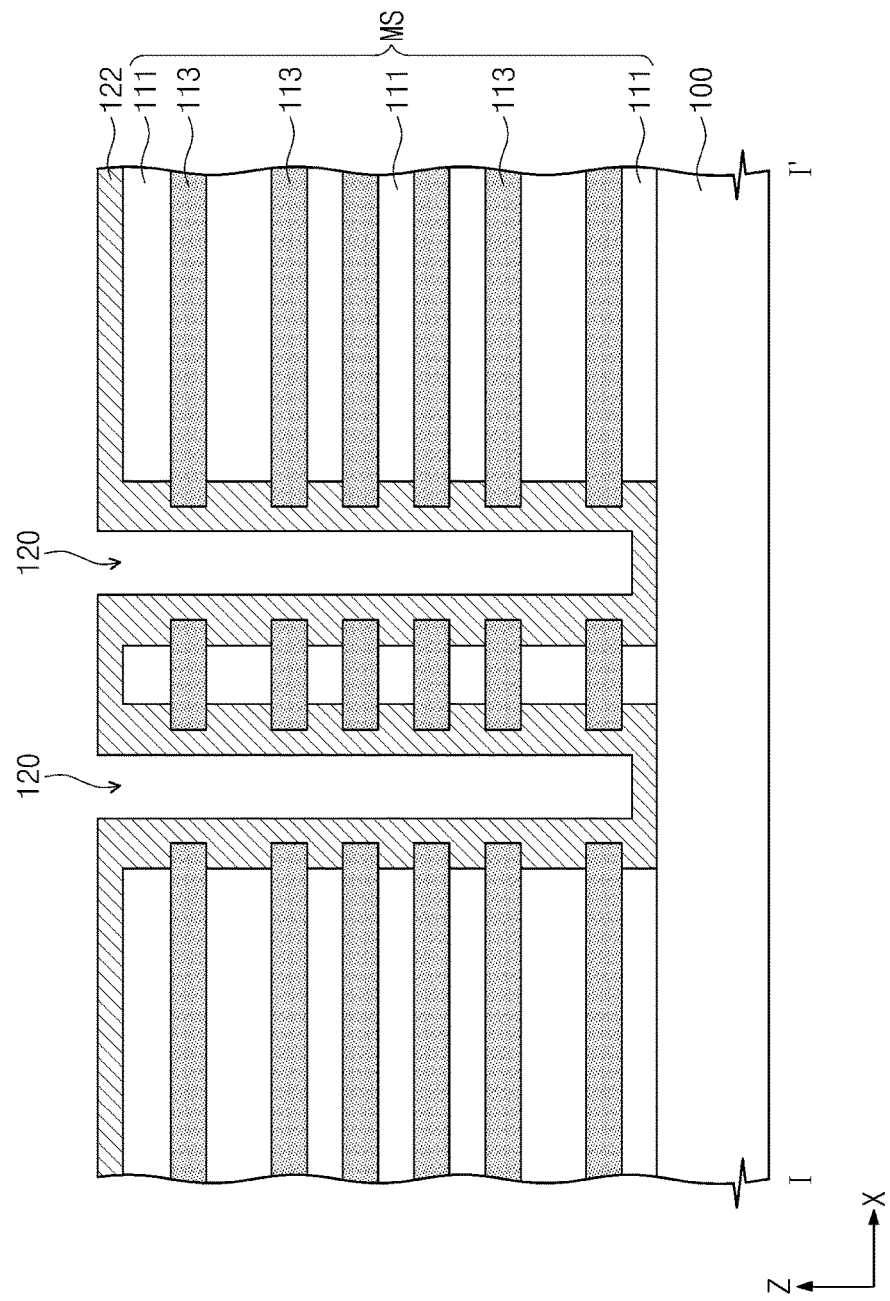

As shown in FIGS. 7A and 7B, a trimming process may be performed to partially etch sidewalls of the insulating layers 111 exposed by the channel holes 120. Accordingly, the sidewalls of the insulating layers 111 may be laterally recessed. That is, as a result of the trimming process, the channel holes 120 may have an increased width between the insulating layers 111.

An etch stop layer 122 may be formed on the molding structure MS. The etch stop layer 122 may be formed to cover the top surface of the substrate 100, the sidewalls of the insulating layers 111 and the sacrificial layers 113 exposed by the channel holes 120, and a top surface of the molding structure MS. Furthermore, the etch stop layer 122 may be formed to fill gap regions between the sacrificial layers 113, which are formed by the lateral recessing of the insulating layers 111. The etch stop layer 122 may be formed of at least one of materials having an etch selectivity with respect to the insulating layers 111 and the sacrificial layers 113. For example, the etch stop layer 122 may be a polysilicon layer.

Figure 8A:
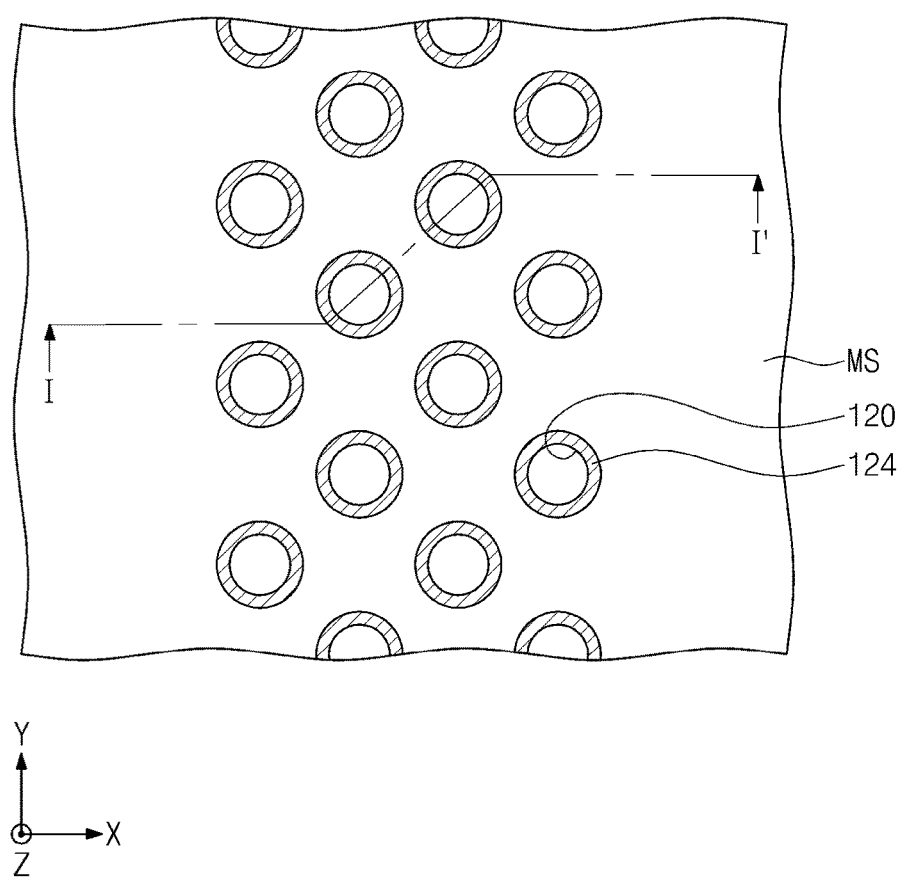
Figure 8B:
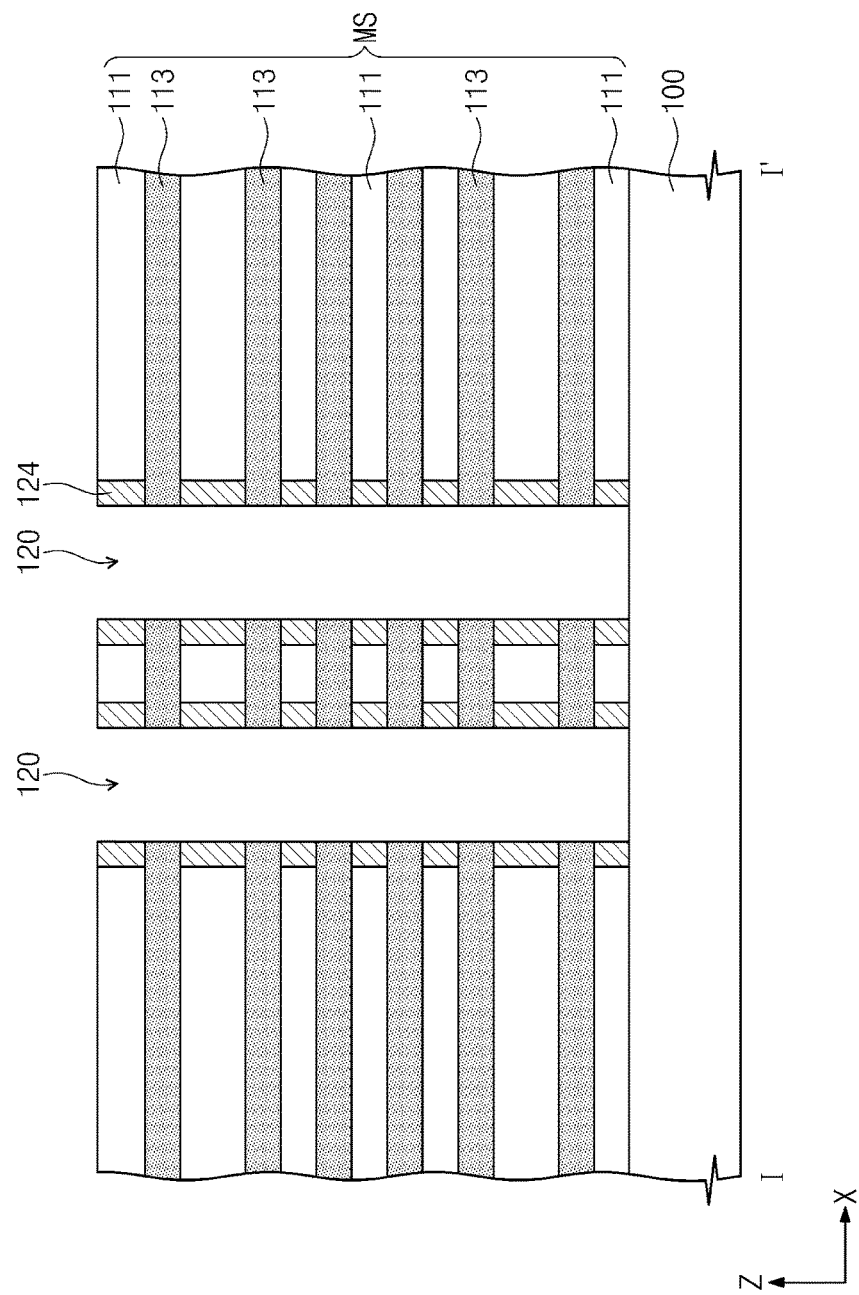

As shown in FIGS. 8A and 8B, an anisotropic etching process may be performed on the etch stop layer 122 to form stoppers 124 in the gap regions between the sacrificial layers 113. The formation of the stoppers 124 may be performed using a dry etching process. Each of the stoppers 124 may have a ring shape and may be disposed between the sacrificial layers 113. Accordingly, a plurality of the stoppers 124 may be stacked, in the vertical direction Z, on the substrate 100 and in each of the channel holes 120.

Figure 9A:
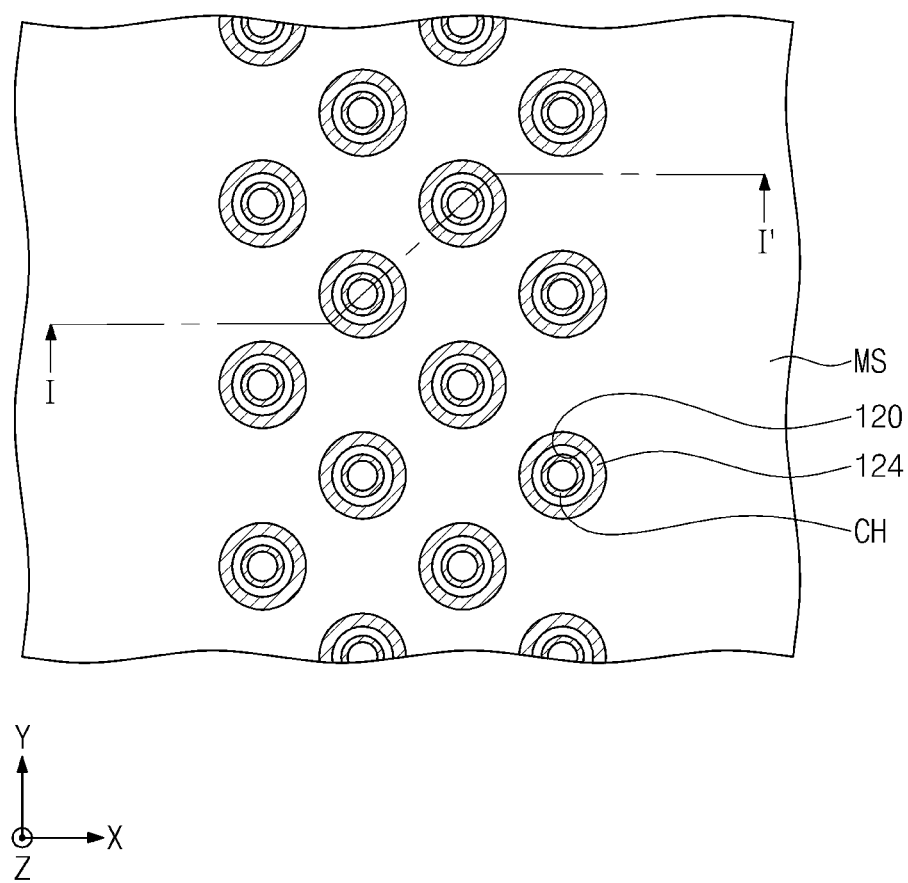
Figure 9B:
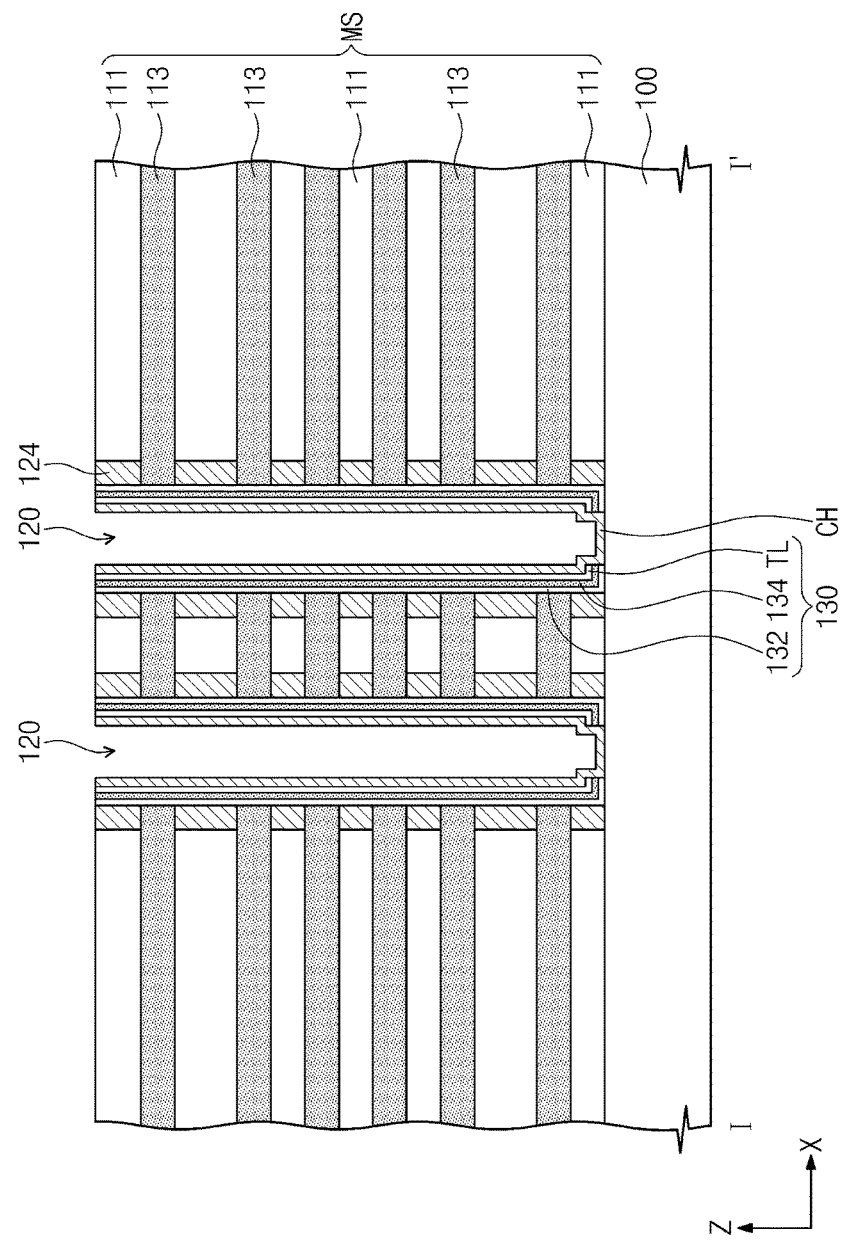

As shown in FIGS. 9A and 9B, the charge storing structure 130 may be formed to cover a sidewall of each of the channel holes 120. The charge storing structure 130 may be formed to partially expose the top surface of the substrate 100 exposed by the channel hole 120. For example, a first insulating layer, a second insulating layer, and a third insulating layer may be formed to conformally cover inner walls of the channel holes 120. A dry etching process may be performed to partially etch the first to third insulating layers covering the top surface of the substrate 100 and to expose the top surface of the substrate 100, and as a result, the charge storing structure 130 may be formed.

The charge storing structure 130 may include a blocking insulating layer 132, a charge storing layer 134, and a tunnel insulating layer TL, which are sequentially formed on sidewalls of the channel holes 120. For example, the blocking insulating layer 132 may be a silicon oxide layer, the charge storing layer 134 may be a silicon nitride layer, and the tunnel insulating layer TL may be a silicon oxynitride layer or a high-k dielectric insulating layer (e.g., of metal oxide). When viewed in a plan view, the stopper 124 may be formed to enclose the charge storing structure 130.

As shown in FIG. 3B, the semiconductor pillars SP may be further formed in the channel holes 120, before the formation of the charge storing structure 130. The semiconductor pillars SP may be grown from the substrate 100 by a selective epitaxial growth process, in which the substrate 100 exposed by the channel holes 120 is used as a seed layer. The semiconductor pillars SP may be formed of, or include, an intrinsic semiconductor material or a p-type semiconductor material.

With respect to FIGS. 9A and 9B, the vertical channels CH may be formed in the channel holes 120 provided with the charge storing structures 130. Each of the vertical channels CH may cover a sidewall of the tunnel insulating layer TL, lower sidewalls of the blocking insulating layer 132 and the charge storing layer 134, which are exposed by the tunnel insulating layer TL, and the top surface of the substrate 100 exposed by the charge storing structure 130. The vertical channels CH may be formed of, or include, at least one of a poly silicon layer, an organic semiconductor layer, or a carbon nano structure.

Figure 10A:
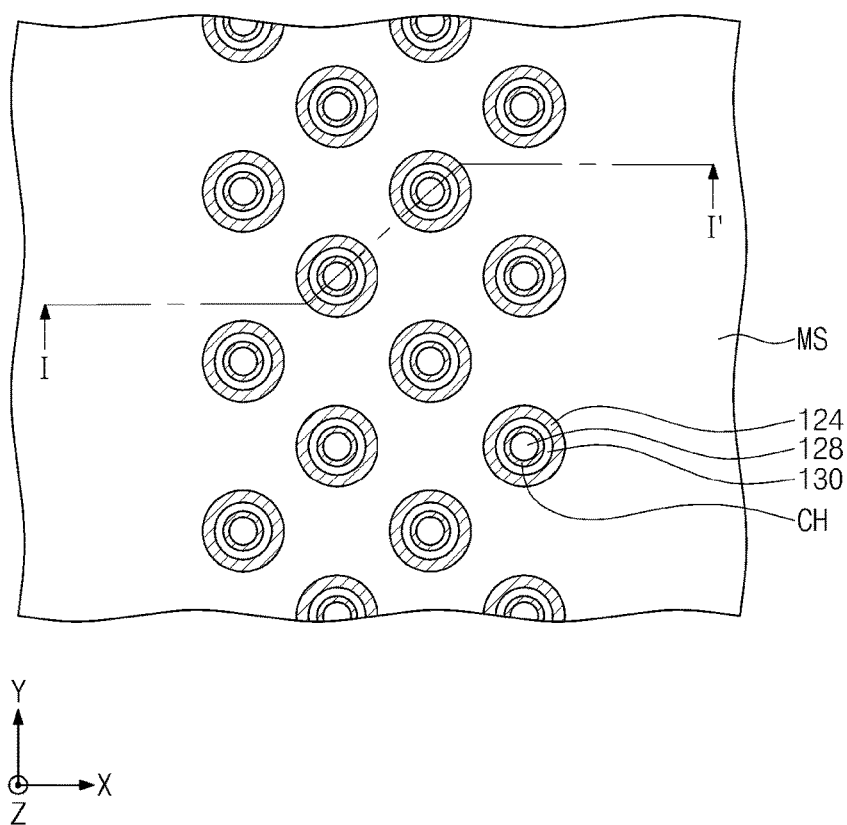
Figure 10B:
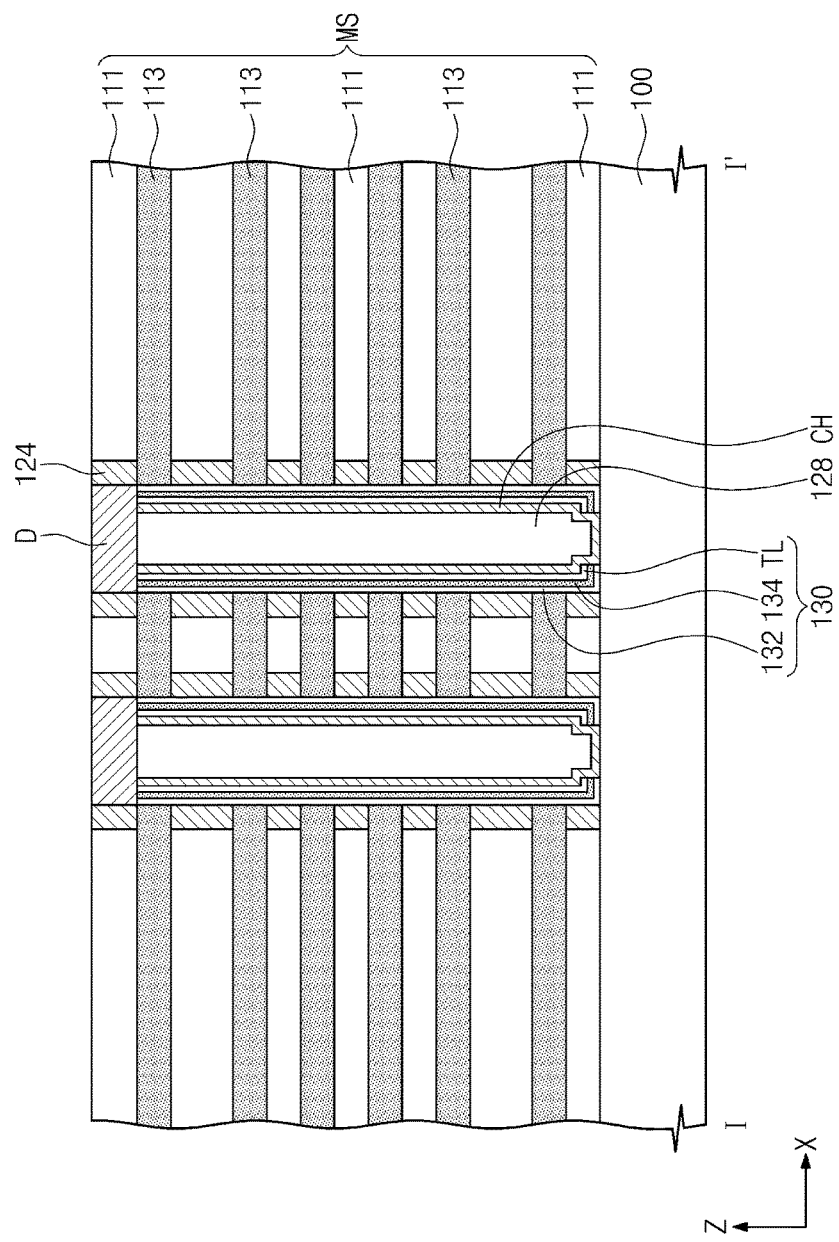

As shown in FIGS. 10A and 10B, the gap-fill patterns 128 may be formed in the channel holes 120 provided with the vertical channels CH. The gap-fill patterns 128 may be formed to completely fill remaining empty spaces of the channel holes 120. The gap-fill patterns 128 may be formed by a spin-on-glass (SOG) process. The gap-fill patterns 128 may be formed of, or include, at least one of insulating materials (e.g., silicon oxide or silicon nitride). Before the formation of the gap-fill patterns 128, the vertical channels CH may be further treated by a hydrogen annealing process (e.g., a thermal treatment process performed under an ambient containing hydrogen or deuterium gas). The hydrogen annealing process may allow crystal defects in the vertical channels CH to be cured.

The pads D may be formed on the charge storing structures 130, the vertical channels CH, and the gap-fill patterns 128. The formation of the pads D may include etching upper portions of the charge storing structures 130, the vertical channels CH, and the gap-fill patterns 128 to form recess regions and filling the recess regions with a conductive material. Alternatively, the pads D may be formed by injecting dopants into the upper portion of the vertical channels CH, and in this case, the pads D may be formed to have a different conductivity type from the vertical channels CH.

Figure 11A:
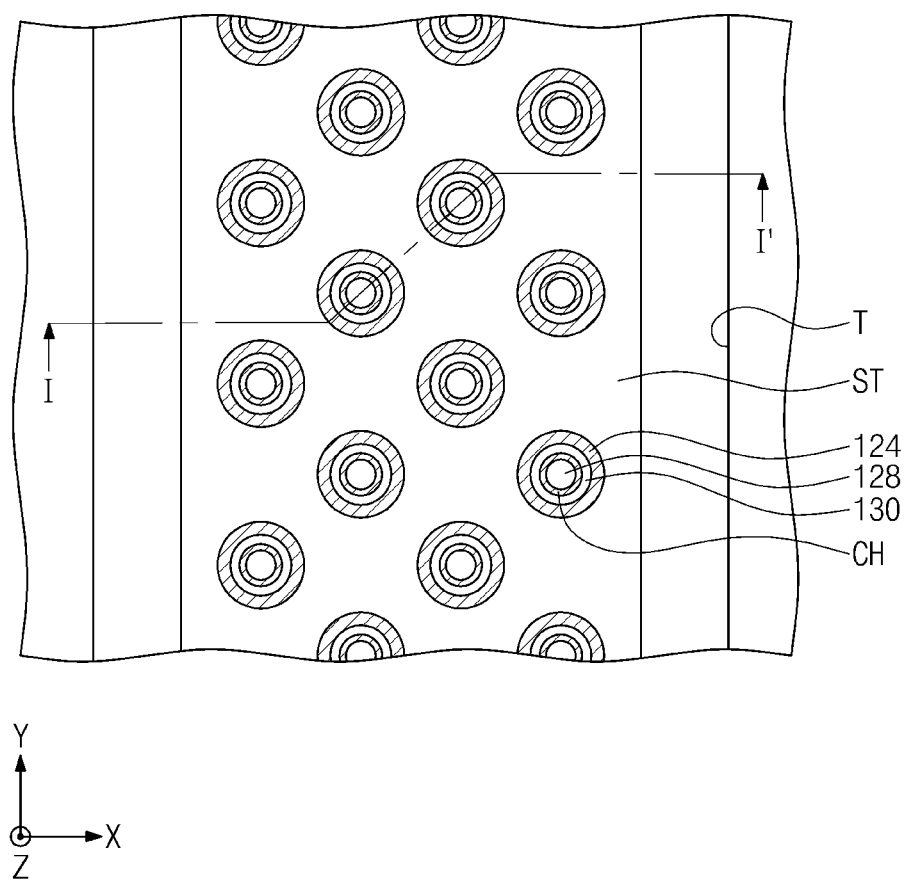

As shown in FIGS. 11A and 11B, trenches T may be formed in the molding structure MS to cut the molding structure MS and thereby to form a plurality of the stack ST. The formation of the trenches T may include forming the mask pattern 140 on the molding structure MS, and then, anisotropically etching the molding structure MS using the mask pattern 140 as an etch mask to expose the top surface of the substrate 100. The trenches T may be formed to extend in the second direction Y. For example, each of the trenches T may be formed to have a linear or rectangular shape.

The trenches T may define the stacks ST. The stacks ST may be arranged spaced apart from each other in the first direction X. Each of the stacks ST may include first sacrificial patterns 112 and second sacrificial patterns 114, which are alternatingly and repeatedly stacked on the substrate 100. The first sacrificial patterns 112 may be formed by patterning the insulating layers 111, and the second sacrificial patterns 114 may be formed by patterning the sacrificial layers 113. In other words, the trenches T may be formed to define or expose sidewalls of the first and second sacrificial patterns 112 and 114.

Figure 12A:
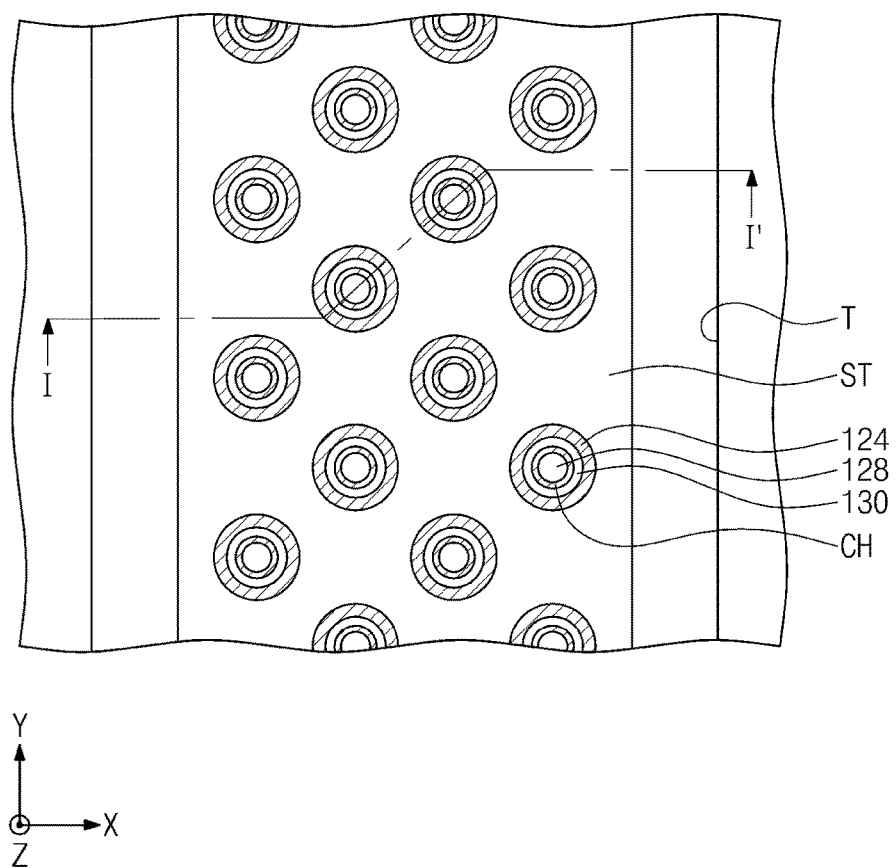
Figure 12B:
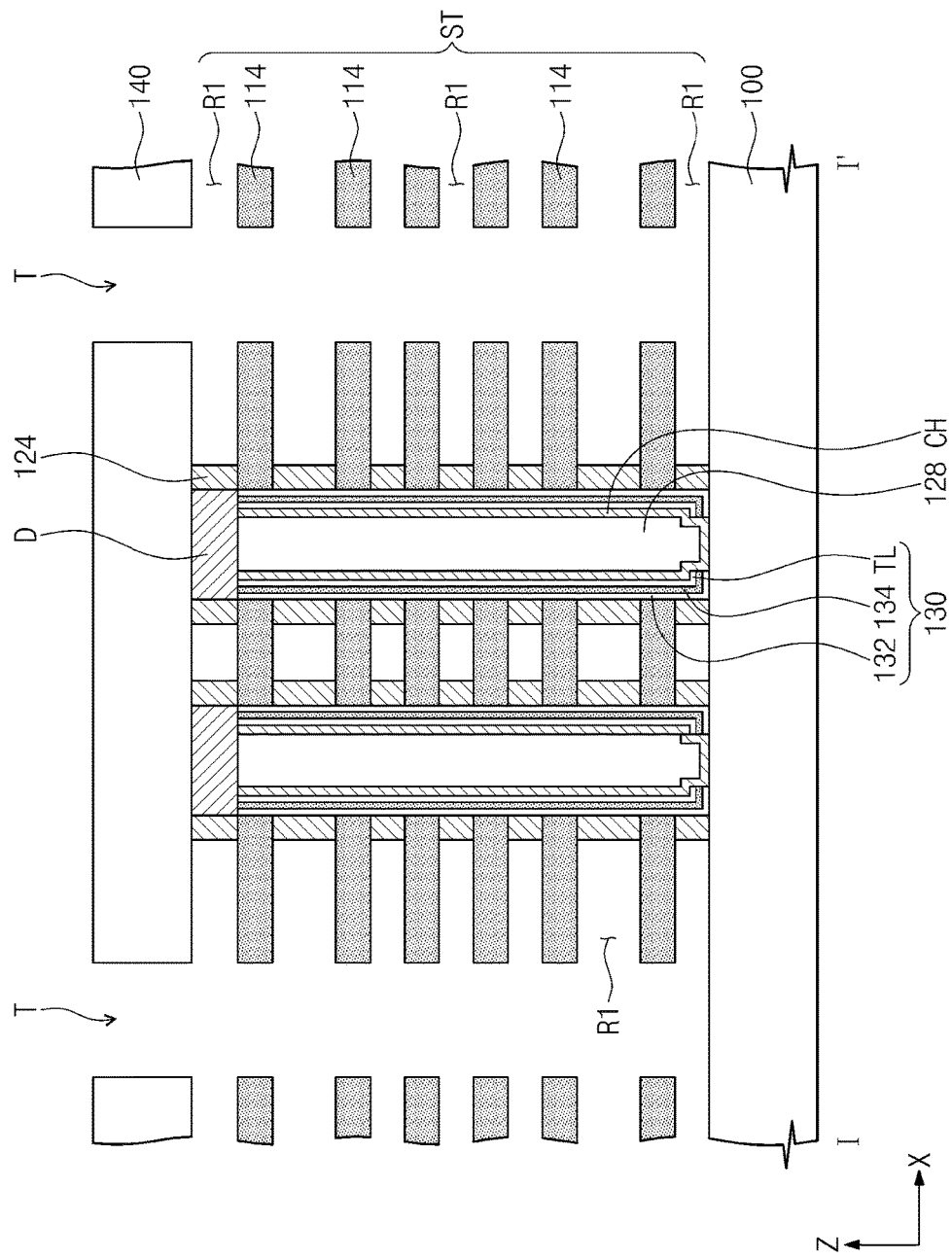

As shown in FIGS. 12A and 12B, the first sacrificial patterns 112 exposed by the trenches T may be removed by an etching process, and as a result, first recess regions R1 may be formed between the second sacrificial patterns 114 to expose the stoppers 124. The removal of the first sacrificial patterns 112 may be performed by an etch recipe having an etch selectivity with respect to the second sacrificial patterns 114 and the stoppers 124 (e.g., by an etchant containing hydrofluoric acid (HF)). Accordingly, it is possible to prevent the second sacrificial patterns 114 and the stoppers 124 from being removed or over-etched during the removal of the first sacrificial patterns 112. Furthermore, due to the presence of the stoppers 124, the blocking insulating layer 132 may not be exposed by the first recess regions R1, and thus, the blocking insulating layer 132 may not be etched by the etching process for forming the first recess regions R1. In other words, it is possible to prevent the blocking insulating layer 132 from being damaged or over-etched during the process of etching the first sacrificial patterns 112.

Figure 13A:
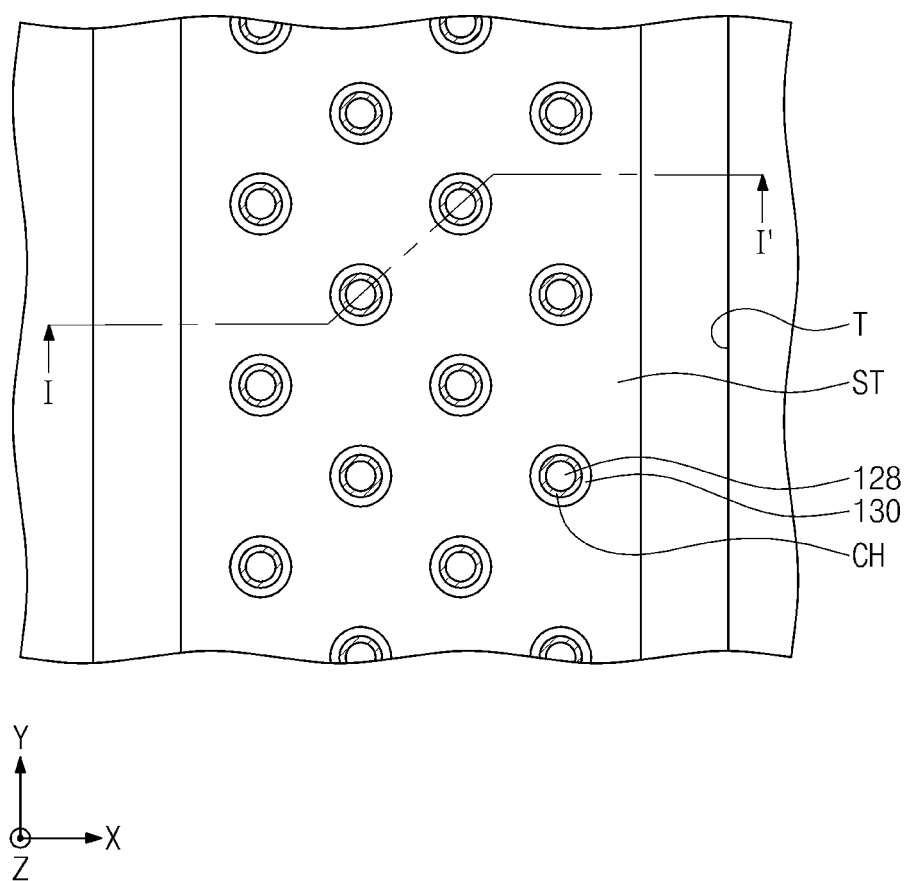
Figure 13B:
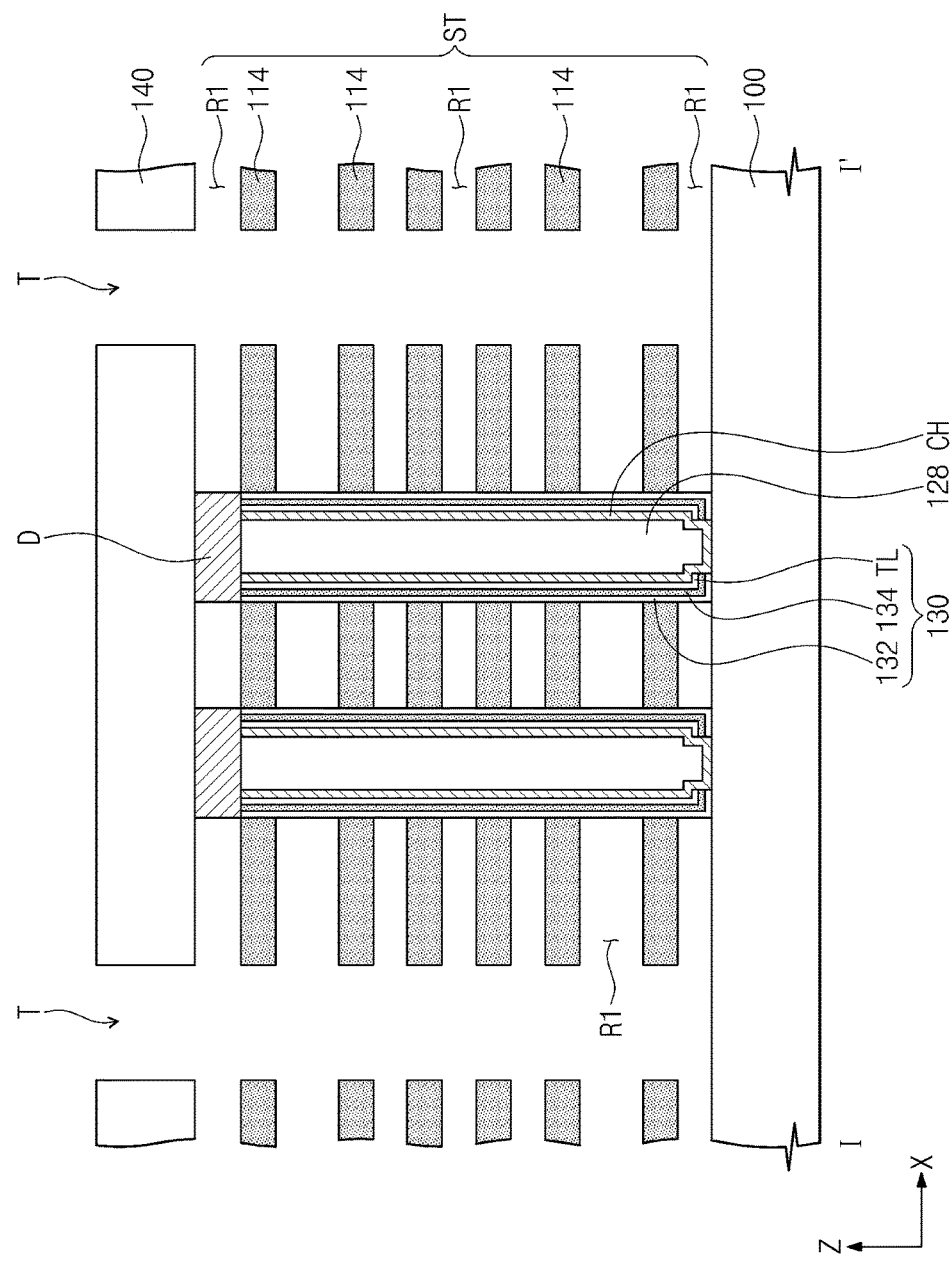

As shown in FIGS. 13A and 13B, the stoppers 124 exposed by the first recess regions R1 may be etched to expose portions of the blocking insulating layer 132 positioned between the second sacrificial patterns 114. For example, the stoppers 124 may be removed using an etch recipe having an etch selectivity with respect to the second sacrificial patterns 114 and the blocking insulating layer 132 (for example, using an etchant containing at least one of nitric acid ($HNO_3$), nitric acid ($HNO_3$), de-ionized water, or acetic acid ($CH_3COOH$)). Accordingly, it is possible to prevent the second sacrificial patterns 114 and the blocking insulating layer 132 from being removed or over-etched in the etching process for removing the stoppers 124.

Figure 14A:
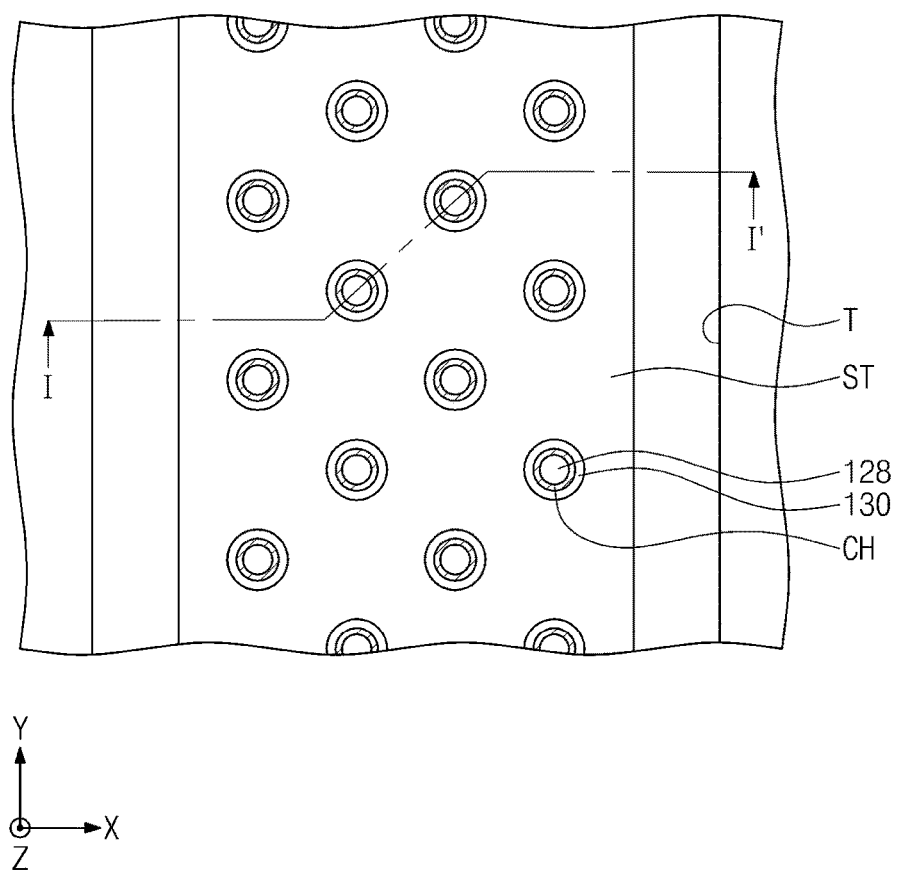
Figure 14B:
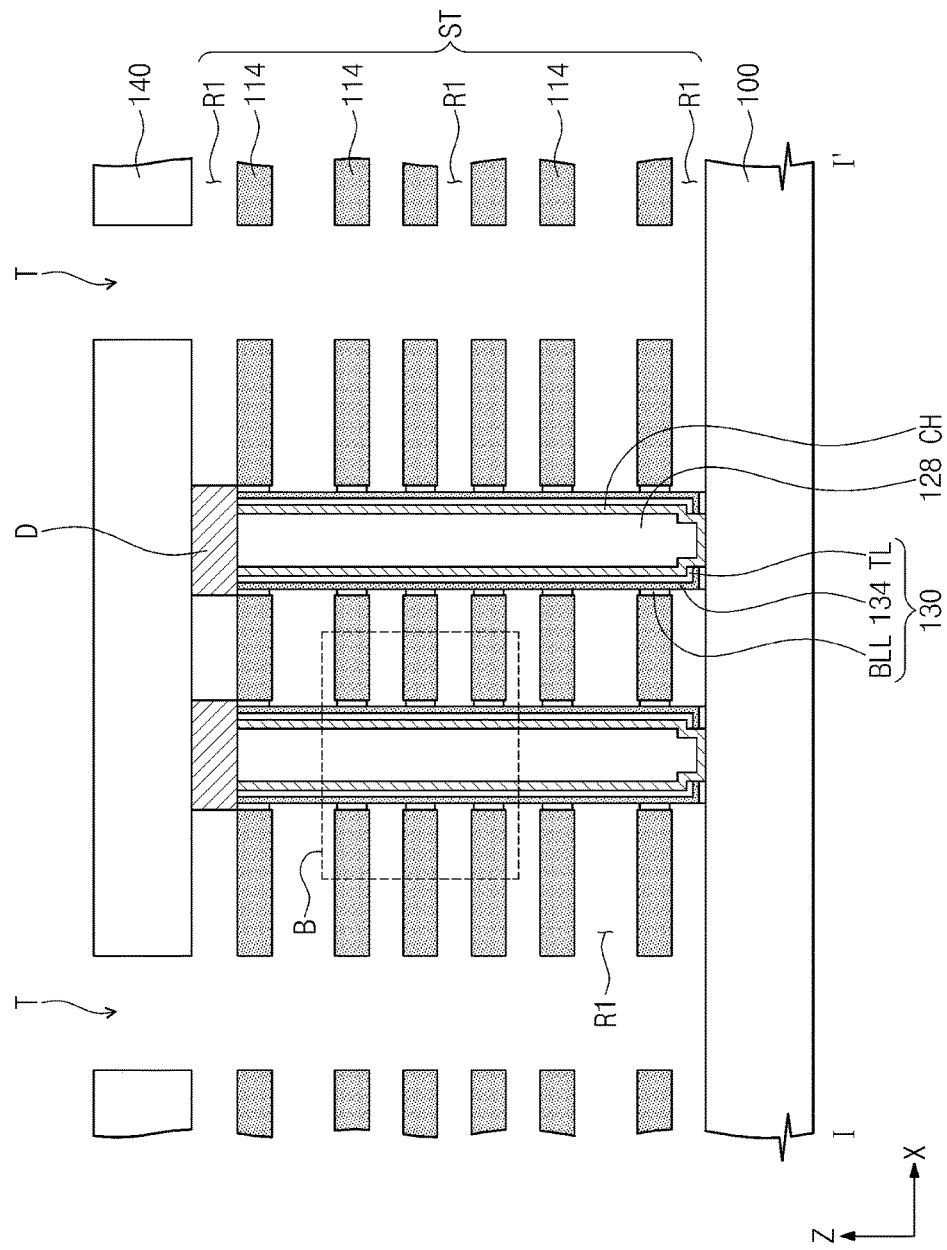

As shown in FIGS. 14A and 14B, the portions of the blocking insulating layer 132 exposed by the first recess regions R1 may be etched to expose portions of the charge storing layer 134 positioned between the second sacrificial patterns 114. The etching of the blocking insulating layer 132 may be performed using an etch recipe having an etch selectivity with respect to the second sacrificial patterns 114 and the charge storing layer 134 (for example, using hydrofluoric acid HF). Accordingly, it is possible to prevent the second sacrificial patterns 114 and the charge storing layer 134 from being removed or over-etched in the etching process of the blocking insulating layer 132.

As a result of the etching of the blocking insulating layer 132, a plurality of the blocking insulating patterns BLL may be formed. The blocking insulating patterns BLL may be formed between the first recess regions R1 adjacent to each other in the vertical direction Z.

As shown in FIGS. 17 through 19, the blocking insulating patterns BLL may be formed to have a variety of different thicknesses and shapes, depending on process conditions in a process of etching the blocking insulating layer 132. Hereinafter, a vertical thickness HT1 of the second sacrificial pattern 114 may be defined as a distance between top and bottom surfaces thereof. The vertical thickness T1 of the blocking insulating pattern BLL may be equal to a vertical distance between vertically adjacent pair of the blocking insulating patterns BLL.

In some exemplary implementations, as shown in FIGS. 17 and 18, the blocking insulating patterns BLL may be formed to have the vertical thickness T1 smaller than the vertical thickness HT1 of the second sacrificial pattern 114. For example, this structure may be formed, when the blocking insulating layer 132 is partially etched by the etching process for etching the portions of the blocking insulating layer 132 exposed by the second sacrificial patterns 114.

As an example, the blocking insulating pattern BLL may be formed to have the vertical thickness T1 increasing in a direction from the second sacrificial patterns 114 toward the charge storing layer 134, as shown in FIG. 17. Here, the minimum of the vertical thickness T1 of the blocking insulating pattern BLL may be smaller than the thickness of the second sacrificial pattern 114.

As another example, the blocking insulating pattern BLL may be formed such that the vertical thickness T1 thereof is substantially uniform, as shown in FIG. 18.

As yet another example, the blocking insulating pattern BLL may be formed such that the vertical thickness T1 thereof is substantially equal to the vertical thickness HT1 of the second sacrificial pattern 114 (i.e., HT1=T1), as shown in FIG. 19. For example, this structure may be formed, when the blocking insulating layer 132 is not etched by the etching process for etching the portions of the blocking insulating layer 132 exposed by the second sacrificial patterns 114. In other words, the structure shown in FIG. 19 may be formed by etching only the desired portions of the blocking insulating layer 132. The blocking insulating pattern BLL may be formed such that the vertical thickness T1 thereof is substantially uniform.

Figure 15A:
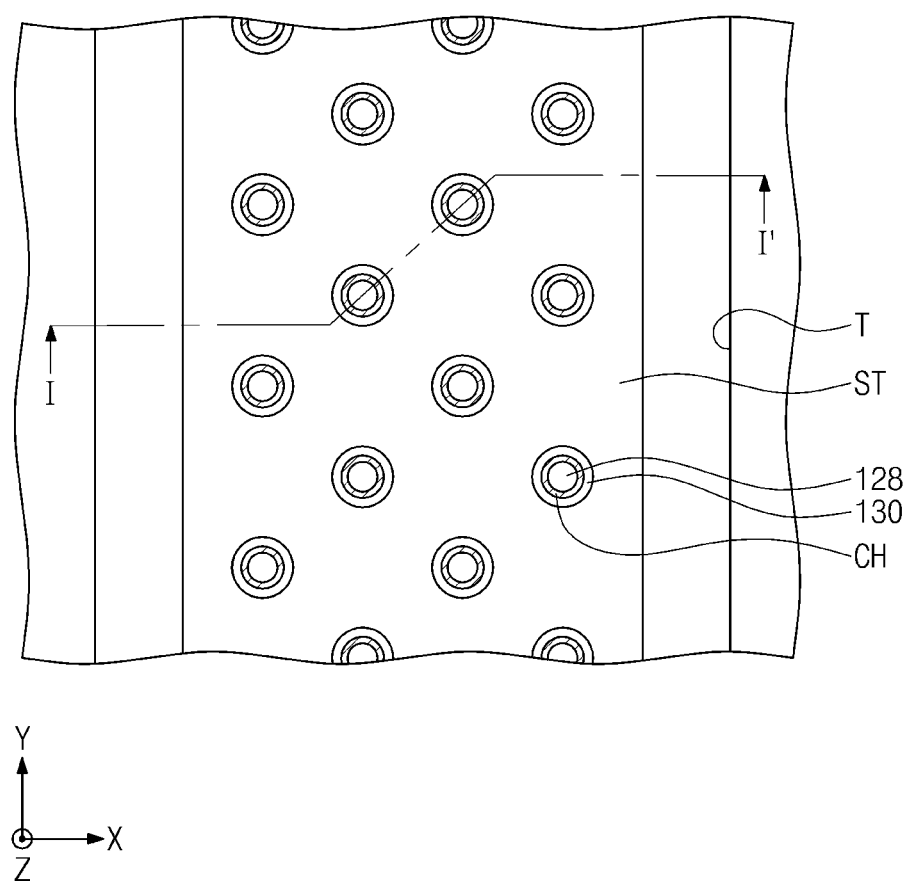
Figure 15B:
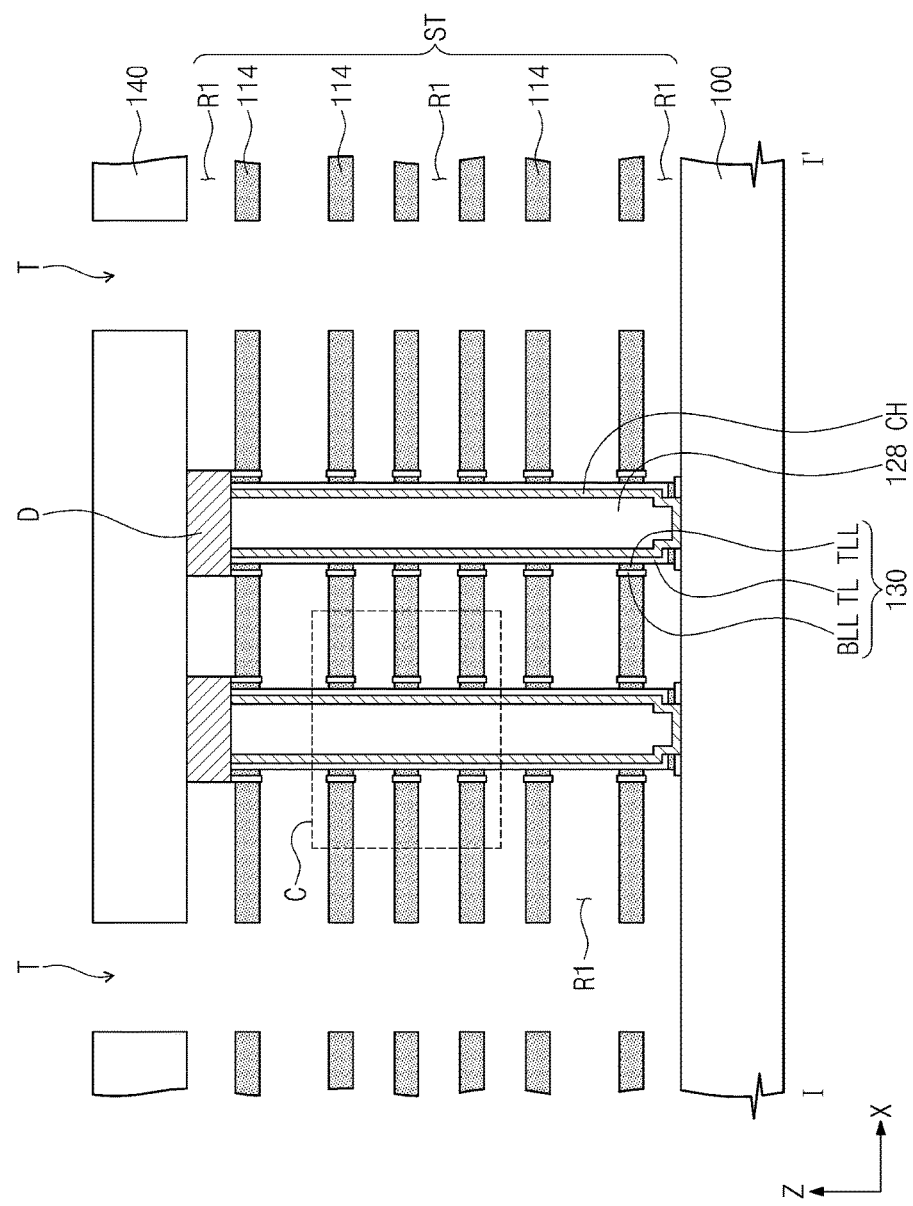

With respect to FIGS. 15A and 15B, portions of the charge storing layer 134 exposed by the first recess regions R1 may be etched to expose portions of the tunnel insulating layer TL positioned between the second sacrificial patterns 114. This etching process may be performed using an etch recipe having an etch selectivity with respect to the blocking insulating patterns BLL and the tunnel insulating layer TL (for example, using phosphoric acid ($H_3PO_4$)). Accordingly, it is possible to prevent the blocking insulating patterns BLL and the tunnel insulating layer TL from being removed or over-etched in the process of etching the charge storing layer 134.

A plurality of the charge storing patterns TLL may be formed by the partial etching of the charge storing layer 134. The charge storing patterns TLL may be formed between the blocking insulating patterns BLL and the tunnel insulating layer TL and may be spaced apart from each other in the vertical direction Z. The charge storing patterns TLL, along with the tunnel insulating layer TL and the blocking insulating patterns BLL, may constitute the charge storing structure 130.

M the case where the charge storing layer 134 includes the same material as the second sacrificial patterns 114, the second sacrificial patterns 114 may also be etched in the etching process for etching the charge storing layer 134. Thus, as shown in FIGS. 20 through 23, when the etching process for etching the charge storing layer 134 is finished, the second sacrificial patterns 114 may have a vertical thickness HT2 that is smaller than the vertical thickness HT1 before the etching process (i.e., HT2<HT1). For example, the vertical thickness HT2 of the second sacrificial pattern 114 may become smaller than the vertical thickness T1 of the blocking insulating pattern BLL.

As shown in FIGS. 20 through 23, the charge storing patterns TLL may be formed to have a variety of different thicknesses and shapes, depending on process conditions in a process of etching the charge storing layer 134. Here, the vertical thickness T2 of the charge storing pattern TLL may be defined as a distance between top and bottom surfaces thereof, which are exposed by the recess regions R1 adjacent to each other in the vertical direction Z.

Figure 20:
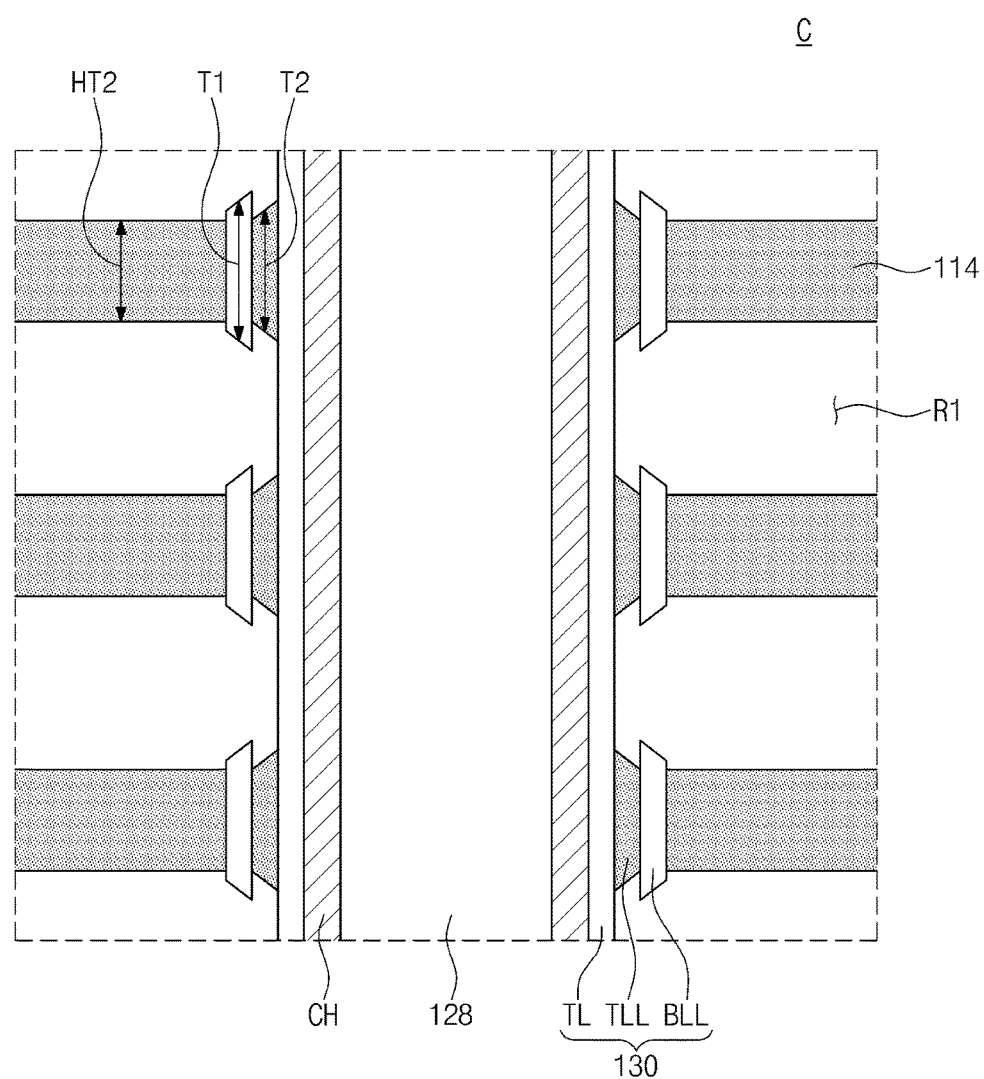
FIGS. 20 through 23 are enlarged views illustrating a portion 'C' of FIG. 15B.

As shown in FIG. 20, the charge storing pattern TLL may be formed to have the vertical thickness T2 increasing in a direction from the blocking insulating patterns BLL toward the tunnel insulating layer TL. Here, the minimum of the vertical thickness T2 of the charge storing patterns TLL may be substantially equal to or smaller than the thickness HT2 of the second sacrificial pattern 114.

Figure 21:
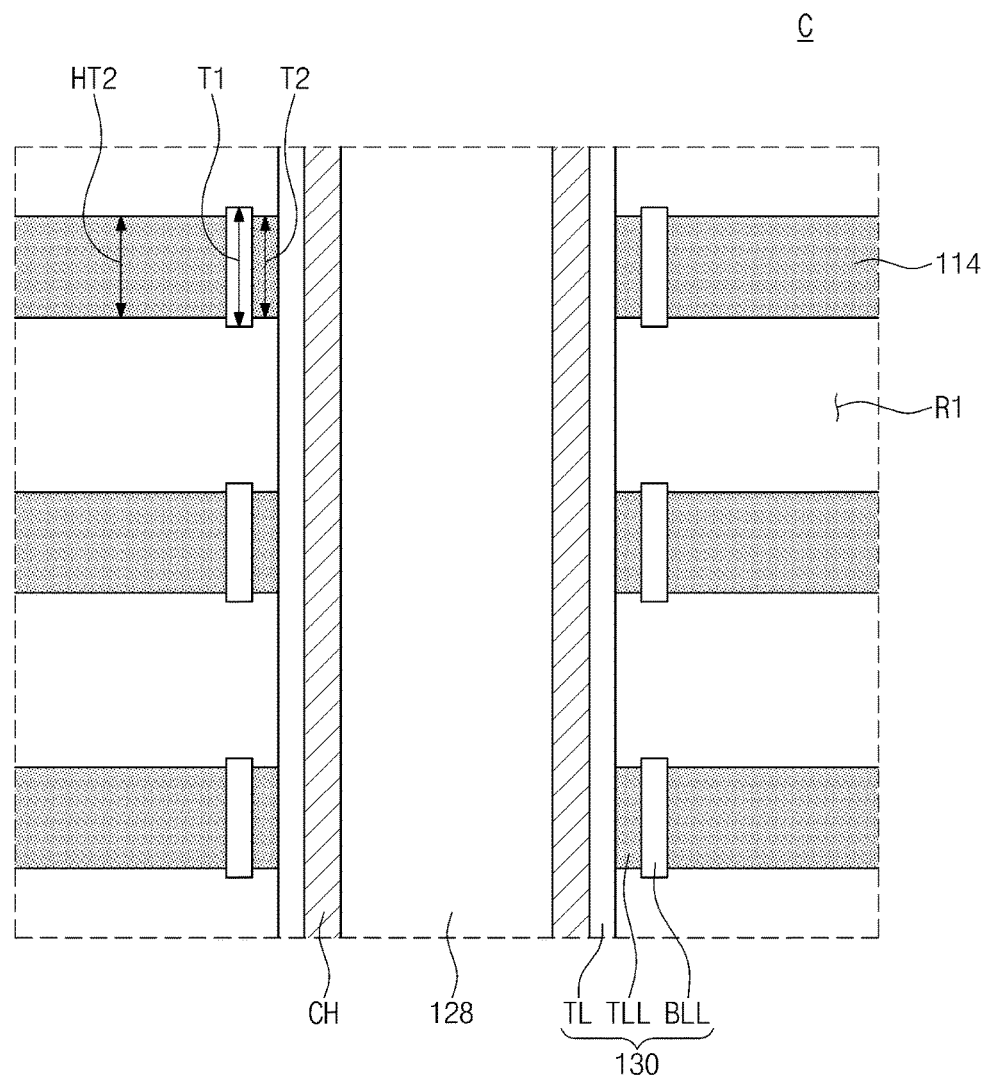

As shown in FIG. 21, the charge storing patterns TLL may be formed to have the vertical thickness T2 that is substantially uniform. Here, the vertical thickness T2 of the charge storing pattern TLL may be substantially equal to the thickness HT2 of the second sacrificial pattern 114 (i.e., T2=HT2) and may be smaller than that of the blocking insulating patterns BLL (i.e., T2<T1).

For example, the structures shown in FIGS. 20 and 21 may be formed, when, during the formation of the recess regions R1, the charge storing layer 134 is etched at a high etch rate, allowing an under-cut region to be formed between the tunnel insulating layer TL and the blocking insulating patterns BLL.

Figure 22:
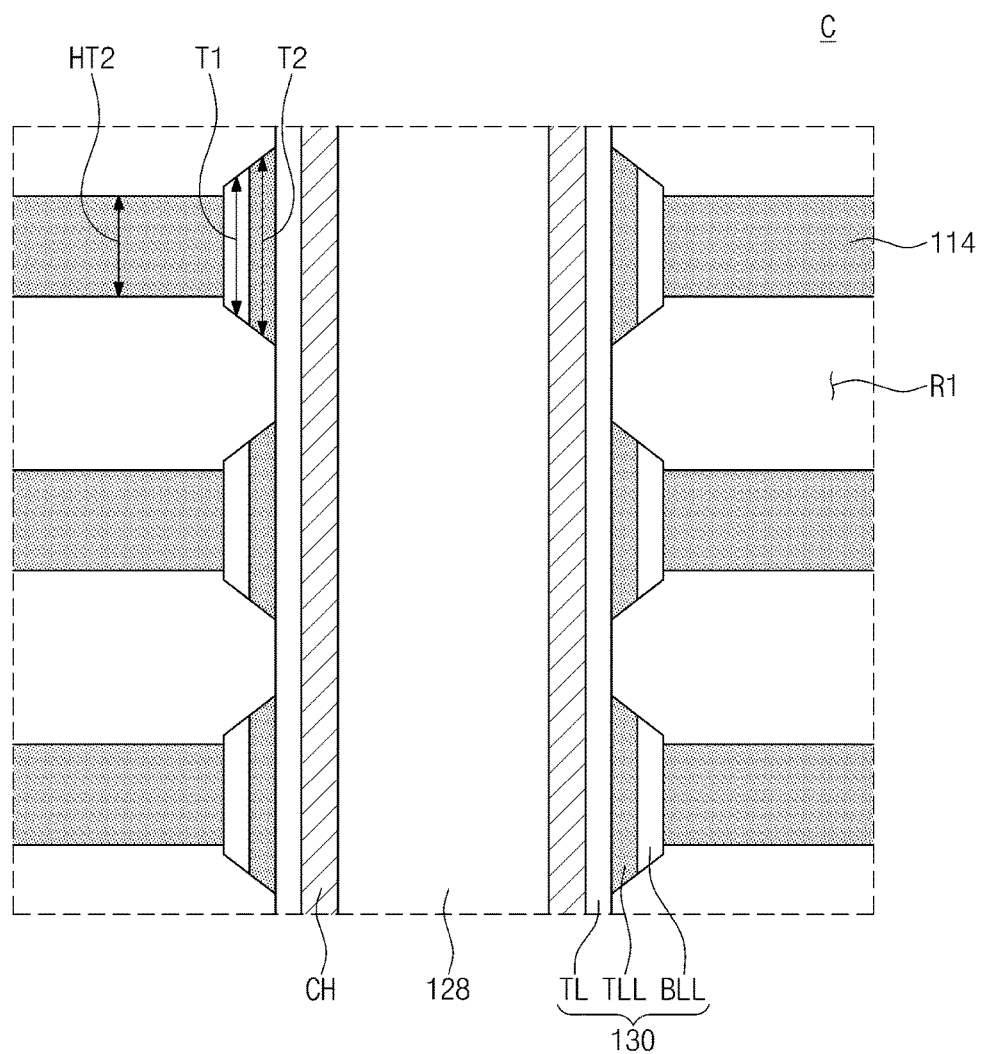

As shown in FIG. 22, the charge storing pattern TLL may be formed to have the vertical thickness T2 increasing in a direction from the blocking insulating patterns BLL toward the tunnel insulating layer BL. Here, the minimum of the vertical thickness T2 of the charge storing pattern TLL may be greater than the thickness HT2 of the second sacrificial pattern 114. The minimum of the vertical thickness T2 of the charge storing pattern TLL may be substantially equal to the maximum of the vertical thickness T1 of the blocking insulating patterns BLL.

Figure 23:
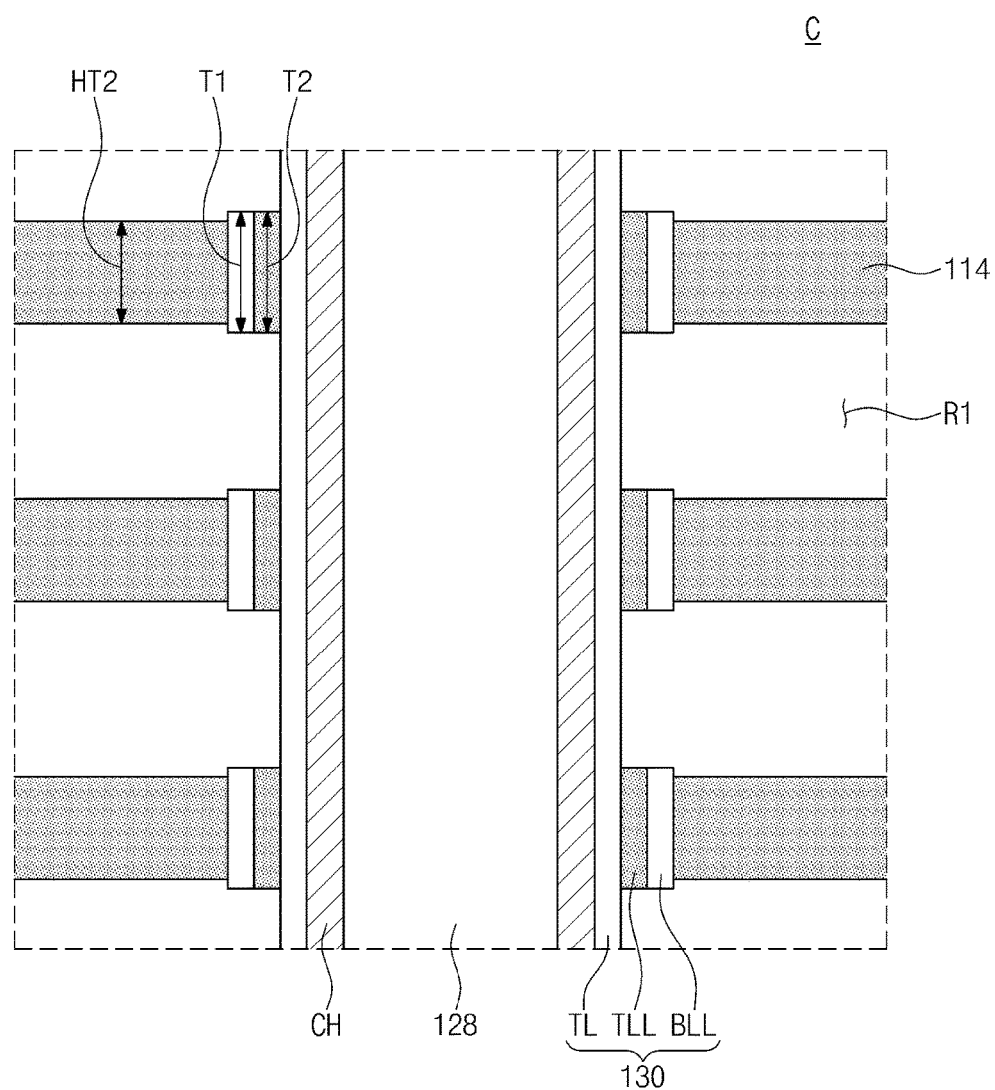

As shown in FIG. 23, the charge storing patterns TLL may be formed to have the vertical thickness T2 that is substantially uniform. Here, the vertical thickness T2 of the charge storing pattern TLL may be greater than the thickness HT2 of the second sacrificial patterns 114 (i.e., T2>HT2) and may be substantially equal to the vertical thickness T1 of the blocking insulating pattern BLL (i.e., T1=T2).

For example, the structures shown in FIGS. 22 and 24 may be formed, when, during the formation of the recess regions R1, the charge storing layer 134 is etched at a low etch rate capable of preventing the under-cut region from being formed between the tunnel insulating layer TL and the blocking insulating patterns BLL. In other words, the structures shown in FIGS. 22 and 24 may be formed, when the charge storing layer 134 exposed by the first recess regions R1 is selectively etched.

Figure 16A:
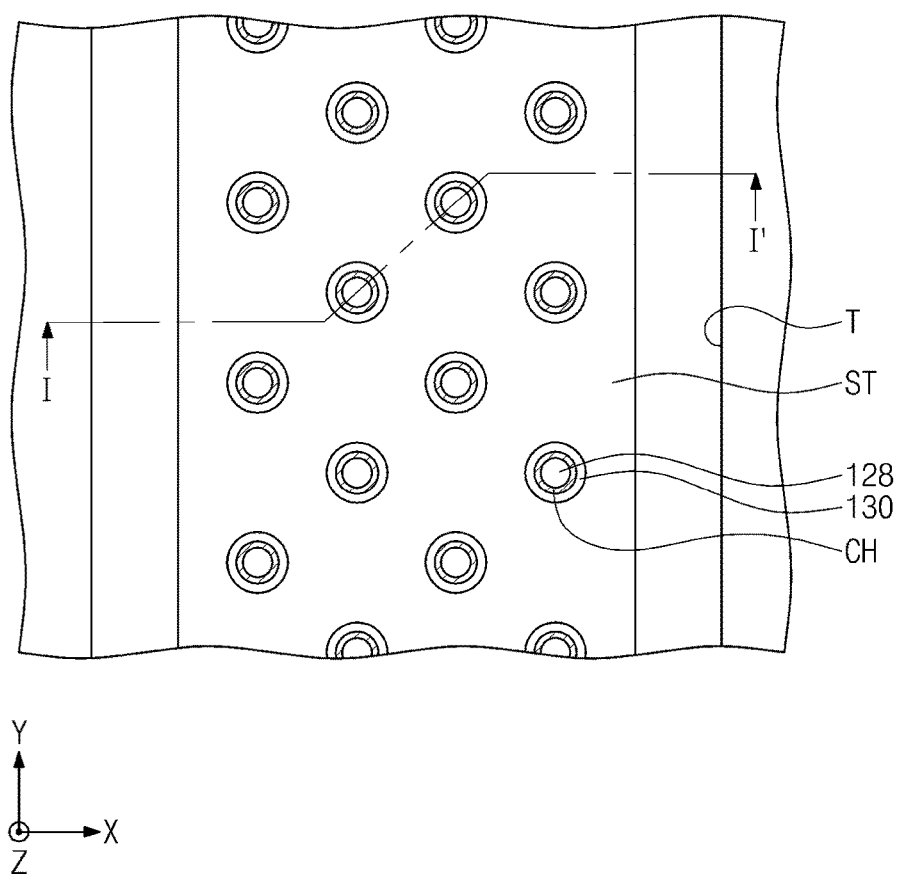
Figure 16B:
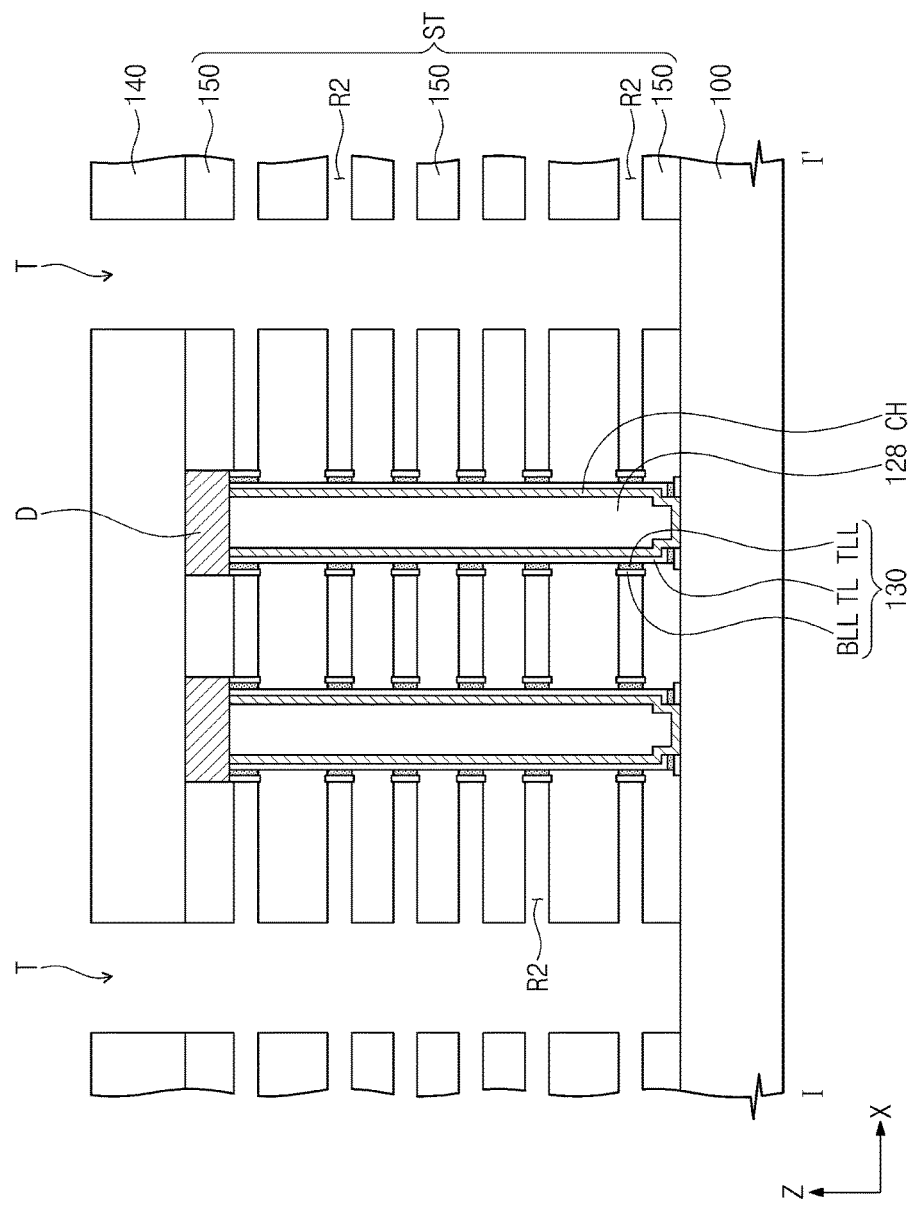

With respect to FIGS. 16A and 16B, the insulating patterns 150 may be formed in the first recess regions R1. For example, the formation of the insulating patterns 150 may include forming an insulating layer (not shown) in the trenches T to fill the first recess regions R1. Thereafter, the insulating layer may be removed from the trenches T to expose the sidewalls of the second sacrificial patterns 114, and thus, the insulating patterns 150 may be locally formed in the first recess regions R1, respectively. In some embodiments, the insulating patterns 150 may be formed, of or include, a silicon oxide layer.

The second sacrificial patterns 114 exposed by the trenches T may be removed to form second recess regions R2 between the insulating patterns 150. The second sacrificial patterns 114 may be formed of a material having an etch selectivity with respect to the insulating patterns 150, and in this case, it is possible to selectively remove the second sacrificial patterns 114 (e.g., without removal of the insulating patterns 150). The process of etching the second sacrificial patterns 114 may be performed by a wet etching process and/or an isotropic dry etching process. For example, if the second sacrificial patterns 114 are formed of silicon nitride and the insulating patterns 150 are formed of silicon oxide, the etching process may be performed using an etching solution containing phosphoric acid.

As shown in FIGS. 3A and 3B, the horizontal insulating layer 160 may be provided in the second recess regions R2 to cover layers exposed by the second recess regions R2. For example, the horizontal insulating layer 160 may be formed to conformally cover the top and bottom surfaces of the insulating patterns 150 and the sidewalls of the blocking insulating patterns BLL, which are exposed by the second recess regions R2.

The horizontal insulating layer 160 may include a layer or a plurality of layers. In certain embodiments, the horizontal insulating layer 160 may be used as a part of a blocking insulating layer of a charge-trapping-type nonvolatile memory transistor. The horizontal insulating layer 160 may be formed of, or include, at least one of high-k dielectric materials (e.g., aluminum oxide ($Al_2O_3$), hafnium oxide ($HfO_2$), zirconium oxide ($ZrO_2$), hafnium aluminum oxide (HfAlO), or hafnium silicon oxide (HfSiO)).

The gate electrodes GE may be formed by filling the second recess regions R2 with a conductive material. The formation of the gate electrodes GE may include forming a conductive layer (not shown) to fill the second recess regions R2, and then, performing an etching process to remove the conductive layer from the trenches T.

After the formation of the gate electrodes GE, the impurity regions 102 may be formed in the substrate 100 exposed by the trenches T. The impurity regions 102 may be formed by an ion implantation process. The impurity regions 102 may be formed to have a different conductivity type from that of the substrate 100.

The spacers 171 and the conductive layer 173 may be sequentially formed in the trenches T. For example, the spacers 171 may be formed to cover the sidewalls of the trenches T. The formation of the spacers 171 may include forming an insulating layer (not shown) to cover side and bottom surfaces of the trenches T, and then, etching the insulating layer to remove the insulating layer from the bottom of the trenches T and expose the top surface of the substrate 100. The spacers 171 may be formed of, or include, silicon oxide or silicon nitride. The conductive layer 173 may be formed to fill the trenches T provided with the spacers 171. The conductive layer 173 may be formed by, for example, a chemical vapor deposition (CVD), physical vapor deposition (PVD), or atomic layer deposition (ALD) process. The conductive layer 173 may be formed of, or include, metals (e.g., tungsten, copper, or aluminum) or transition metals (e.g., titanium or tantalum).

After the formation of the conductive layer 173, the interlayered insulating layer 175 may be formed on the mask pattern 140. The interlayered insulating layer 175 may be formed to cover top surfaces of the mask pattern 140, the spacer 171, and the conductive layer 173. The interlayered insulating layer 175 may be formed of, or include, at least one of insulating materials (e.g., silicon oxide, silicon nitride, or silicon oxynitride).

The contact plugs 177 may be formed to pass through the interlayered insulating layer 175 and the mask pattern 140 and to be in contact with the pads D, respectively. The contact plugs 177 may be formed of, or include, doped silicon or conductive materials (e.g., tungsten (W), copper (Cu), or aluminum (Al)).

The bit lines BL may be formed on the interlayered insulating layer 175 to be in contact with the contact plugs 177. The bit lines BL may be disposed to cross the stacks ST and may be connected to the vertical channels CH arranged in the first direction X through the contact plugs 177. The bit lines BL may be formed of, or include, a conductive material (e.g., tungsten (W)).

According to exemplary implementations, a semiconductor memory device may include a plurality of charge storing patterns, which are provided spaced apart from each other in a direction normal to a top surface of a substrate. Accordingly, it is possible to prevent electric charges stored in one of the charge storing patterns from being diffused or spread to others of the charge storing patterns.

According to exemplary implementations, a method of fabricating a semiconductor memory device may include forming stoppers, which are formed of a material having an etch selectivity with respect to a silicon oxide layer and a nitride layer, between vertically adjacent ones of sacrificial patterns. The stoppers may make it possible to prevent a blocking insulating layer from being unintentionally etched, when insulating patterns are etched to expose the blocking insulating layer and separate a charge storing layer. Accordingly, when the insulating patterns are etched, the blocking insulating layer is not over-etched, and this may make it possible to prevent electric characteristics of a semiconductor memory device from being deteriorated.

While exemplary implementations have been particularly shown and described, it will be understood by one of ordinary skill in the art that variations in form and detail may be made therein without departing from the spirit and scope of the attached claims.

What is claimed is:

1. A semiconductor memory device, comprising:
a stack including insulating patterns stacked on a substrate in a vertical direction and gate electrodes interposed between the insulating patterns;
vertical channels passing through the stack and connected to the substrate including a first vertical channel;
a tunnel insulating layer continuously extending in the vertical direction between the stack and the first vertical channel from a location below the gate electrodes to a location above the gate electrodes;
charge storing patterns provided between the tunnel insulating layer and the gate electrodes and spaced apart from each other in the vertical direction; and
blocking insulating patterns provided between the charge storing patterns and the gate electrodes and spaced apart from each other in the vertical direction,
wherein each of the charge storing patterns have top and bottom surfaces that are in contact with corresponding ones of the insulating patterns that are adjacent thereto, and
wherein the blocking insulating patterns have a vertical thickness that is greater than that of the gate electrodes.

2. The semiconductor memory device of claim 1,
wherein each of the charge storing patterns are formed in a ring shape and have an outermost boundary in the horizontal direction disposed between a corresponding blocking insulating pattern and the first vertical channel,
wherein each of the blocking insulating patterns are ring shaped and have an outermost boundary in the horizontal direction disposed between a corresponding gate electrode and the first vertical channel, and
wherein each of the ring shaped blocking insulating patterns tapers in a direction toward the corresponding gate electrode so that an inner portion of each ring shaped blocking insulating pattern has a greater vertical thickness than that of its outer portion.

3. The semiconductor memory device of claim 2, wherein each of the ring shaped charge storing patterns tapers in a direction toward the corresponding gate electrode so that an inner portion of each ring shaped charge storing patterns has a greater vertical thickness than that of its outer portion.

4. The semiconductor memory device of claim 1, wherein the charge storing patterns have a vertical thickness that is substantially equal to that of the blocking insulating patterns.

5. The semiconductor memory device of claim 1, wherein the charge storing patterns have a vertical thickness that is greater than a maximum vertical thickness of the blocking insulating patterns.

6. The semiconductor memory device of claim 1, wherein the vertical thickness of each of the blocking insulating patterns is uniform.

7. The semiconductor memory device of claim 6, wherein each of the charge storing patterns have a vertical thickness that is uniform and is smaller than that of the corresponding blocking insulating pattern.

8. The semiconductor memory device of claim 6, wherein each of the charge storing patterns have a vertical thickness that is uniform and is substantially equal to that of the corresponding blocking insulating pattern.

9. The semiconductor memory device of claim 1,
wherein the insulating patterns include a first insulating pattern extending between a first pair of neighboring ones of the gate electrodes, between a first pair of neighboring ones of the charge storing patterns and between a first pair of neighboring ones of the blocking insulating patterns and contacting the tunnel insulating layer,
wherein the first insulating pattern has a first vertical thickness between the first pair of the gate electrodes, the first insulating pattern has a second vertical thickness between the first pair of charge storing patterns and the first insulating pattern has a third vertical thickness between the first pair of blocking insulating patterns,
wherein the first vertical thickness is greater than the second vertical thickness, and
wherein the third vertical thickness is greater than the second vertical thickness.

10. The semiconductor memory device of claim 1,
wherein the insulating patterns include a first insulating pattern extending between a first pair of neighboring ones of the gate electrodes, between a first pair of neighboring ones of the charge storing patterns and between a first pair of neighboring ones of the blocking insulating patterns and contacting the tunnel insulating layer,
wherein the first insulating pattern has a first vertical thickness between the first pair of the gate electrodes, the first insulating pattern has a second vertical thickness between the first pair of charge storing patterns and the first insulating pattern has a third vertical thickness between the first pair of blocking insulating patterns,
wherein the first vertical thickness is greater than the second vertical thickness, and
wherein the second vertical thickness is greater than the third vertical thickness.

11. A semiconductor memory device, comprising:
a stack including gate electrodes stacked on a substrate in a vertical direction and insulating patterns interposed between the gate electrodes;
vertical channels passing through the stack and connected to the substrate, the vertical channels comprising a first vertical channel;
a tunnel insulating layer continuously extending in the vertical direction between the stack and the first vertical channel from a location below the gate electrodes to a location above the gate electrodes;
charge storing patterns provided between the tunnel insulating layer and the gate electrodes, and spaced apart from each other in the vertical direction; and
blocking insulating patterns provided between the charge storing patterns and the gate electrodes, and spaced apart from each other in the vertical direction,
wherein the blocking insulating patterns have a vertical thickness gradually increasing in a direction away from the gate electrodes and toward the charge storing patterns,
the charge storing patterns a vertical thickness gradually increasing in a direction away from the blocking insulating patterns and toward the tunnel insulating layer, and
each of the insulating patterns has a vertical side surface that is in contact a vertical side surface of the tunnel insulation layer.

12. The semiconductor memory device of claim 11, wherein a minimum vertical thickness of the blocking insulating patterns is greater than that of the gate electrodes.

13. The semiconductor memory device of claim 11, wherein a maximum vertical thickness of the blocking insulating patterns is greater than a minimum vertical thickness of the charge storing patterns.

14. The semiconductor memory device of claim 11, wherein a maximum vertical thickness of the blocking insulating patterns is substantially equal to a minimum vertical thickness of the charge storing patterns.

15. The semiconductor memory device of claim 11,
wherein the insulating patterns extend between neighboring ones of the blocking insulating patterns that are adjacent to each other in the vertical direction, between neighboring ones of the charge storing patterns adjacent to each other in the vertical direction and are in contact with the tunnel insulating layer, and
wherein the insulating patterns positioned between the blocking insulating patterns and the charge storing patterns have a vertical thickness which decreases in a direction toward the tunnel insulating layer.

16. A semiconductor memory device, comprising:
a substrate;
a stack including insulating patterns stacked on said substrate in a vertical direction and gate electrodes interposed between the insulating patterns;
a conductive layer provided adjacent to said stack having one end connected to an impurity region of said substrate;
vertical channels passing through said stack, each vertical channel having a first end connected to said substrate, the vertical channels comprising a first vertical channel;
a tunnel insulating layer continuously extending in the vertical direction between the stack and the first vertical channel from a location below the gate electrodes to a location above the gate electrodes;
charge storing patterns provided between the tunnel insulating layer and corresponding ones of the gate electrodes, the charge storing patterns being spaced apart from and discrete from each other in the vertical direction; and
blocking insulating patterns provided between corresponding ones of the charge storing patterns and the gate electrodes, the blocking insulating patterns being spaced apart from each other in the vertical direction,
wherein each of the charge storing patterns have top and bottom surfaces that are in contact with corresponding ones of the insulating patterns that are adjacent thereto, and
wherein each of the blocking insulating patterns has top and bottom surfaces that are in contact with corresponding ones of the insulating patterns that are adjacent thereto, and
wherein the blocking insulating patterns have a vertical thickness that is greater than that of the gate electrodes.

17. The semiconductor memory device of claim 16,
wherein each of the charge storing patterns are formed in a ring shape and have an outermost boundary in the horizontal direction disposed between a corresponding blocking insulating pattern and the first vertical channel,
wherein each of the blocking insulating patterns are ring shaped and have an outermost boundary in the horizontal direction disposed between a corresponding gate electrode and the first vertical channel, and wherein each of the blocking insulating patterns tapers in a direction toward the corresponding gate electrode so that an inner portion of each ring shaped blocking insulating pattern has a greater vertical thickness than that of its outer portion.

18. The semiconductor memory device of claim 17, wherein each of the charge storing patterns tapers in a direction toward the corresponding gate electrode so that an inner portion of each ring shaped charge storing pattern has a greater vertical thickness than that of its outer portion.

19. The semiconductor memory device of claim 16, wherein the charge storing patterns have a vertical thickness that is substantially equal to that of the blocking insulating patterns.

20. The semiconductor memory device of claim 16, wherein the charge storing patterns have a vertical thickness that is greater than a maximum vertical thickness of the blocking insulating patterns.

* * * * *